US011481154B2

(12) United States Patent
Dutta et al.

(10) Patent No.: US 11,481,154 B2
(45) Date of Patent: Oct. 25, 2022

(54) NON-VOLATILE MEMORY WITH MEMORY ARRAY BETWEEN CIRCUITS

(71) Applicant: SANDISK TECHNOLOGIES LLC, Addison, TX (US)

(72) Inventors: Deepanshu Dutta, Fremont, CA (US); James Kai, Santa Clara, CA (US); Johann Alsmeier, San Jose, CA (US); Jian Chen, San Jose, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 17/149,867

(22) Filed: Jan. 15, 2021

(65) Prior Publication Data

US 2022/0229588 A1    Jul. 21, 2022

(51) Int. Cl.
*G06F 3/00* (2006.01)
*G06F 3/06* (2006.01)
(Continued)

(52) U.S. Cl.
CPC .......... *G06F 3/0659* (2013.01); *G06F 3/0604* (2013.01); *G06F 3/0679* (2013.01);
(Continued)

(58) Field of Classification Search
CPC . G11C 29/42; G11C 29/44; G11C 2029/1202; G11C 29/12005; G11C 29/78; G11C 11/5628; G11C 11/5642; G11C 11/5671; G11C 16/0483; G11C 16/10; G11C 16/26; G11C 2029/0411; G11C 2029/1802; G11C 2029/1804; G11C 2211/5641; G11C 29/00; G11C 29/18; G11C 5/025; G11C 5/04; G11C 7/1006; G11C 8/08; G11C 8/14; G11C 29/12;
(Continued)

(56) References Cited

U.S. PATENT DOCUMENTS 5,838,832 A    11/1998  Barnsley
7,226,026 B2    9/2007  Gongwer
(Continued)

OTHER PUBLICATIONS

Schmier, et al., "Non-Volatile Storage System With Reduced Program Transfers," U.S. Appl. No. 16/223,716, filed Dec. 18, 2018.
(Continued)

*Primary Examiner* — Thong Q Le
(74) *Attorney, Agent, or Firm* — Vierra Magen Marcus LLP

(57) ABSTRACT

An integrated memory assembly comprises a memory die and a control die bonded to the memory die. The memory die comprises a three dimensional non-volatile memory structure and a first plurality of sense amplifiers. The first plurality of sense amplifiers are connected to the memory structure and are positioned on a substrate of the memory die between the memory structure and the substrate such that the memory structure is directly above the first plurality of sense amplifiers. The control die comprises a second plurality of sense amplifiers that are connected to the memory structure. The first plurality of sense amplifiers and the second plurality of sense amplifiers are configured to be used to concurrently perform memory operations.

20 Claims, 26 Drawing Sheets

(51) Int. Cl.
*G11C 16/26* (2006.01)
*G11C 16/10* (2006.01)
*H01L 27/11582* (2017.01)
*G11C 16/04* (2006.01)
*H01L 27/11565* (2017.01)

(52) U.S. Cl.
CPC .......... *G11C 16/0483* (2013.01); *G11C 16/10* (2013.01); *G11C 16/26* (2013.01); *H01L 27/11582* (2013.01); *H01L 27/11565* (2013.01)

(58) Field of Classification Search
CPC ......... G11C 16/04; G11C 16/08; G11C 16/24; G11C 16/34; G11C 7/06; G11C 11/34; G11C 11/56; G11C 16/28; G11C 29/02; G11C 29/50; G06F 11/10; H01L 27/11519; H01L 27/11524; H01L 27/11556; H01L 27/11565
See application file for complete search history.

(56) References Cited

U.S. PATENT DOCUMENTS

| | | | |
|---|---|---|---|
| 7,409,473 B2 | 8/2008 | Conley | |
| 7,446,575 B2 | 12/2008 | Shalvi | |
| 7,849,381 B2 | 12/2010 | Tomlin | |
| 8,111,548 B2 | 2/2012 | Mokhlesi | |
| 8,144,512 B2 | 3/2012 | Huang | |
| 8,301,912 B2 | 10/2012 | Lin | |
| 8,341,501 B2 | 12/2012 | Franceschini | |
| 8,756,365 B2 | 6/2014 | Sharon | |
| 8,799,559 B2 | 8/2014 | Sharon | |
| 8,874,994 B2 | 10/2014 | Sharon | |
| 8,953,355 B2 | 2/2015 | Nakanishi | |
| 9,165,649 B2 | 10/2015 | Sharon | |
| 9,575,683 B2 | 2/2017 | Achtenberg | |
| 10,283,493 B1 | 5/2019 | Nishida | |
| 10,381,327 B2 | 8/2019 | Ramachandra | |
| 10,387,303 B2 | 8/2019 | Mehra | |
| 10,459,644 B2 | 10/2019 | Mehra | |
| 10,565,123 B2 | 2/2020 | Song | |
| 10,651,153 B2 | 5/2020 | Fastow | |
| 2013/0103891 A1 | 4/2013 | Sharon | |
| 2014/0136761 A1 | 5/2014 | Li | |
| 2017/0148510 A1 | 5/2017 | Bazarsky | |
| 2019/0179568 A1 | 6/2019 | Hsu | |
| 2019/0341375 A1 | 11/2019 | Hirano | |
| 2020/0243486 A1 | 7/2020 | Quader | |
| 2021/0373993 A1* | 12/2021 | Sharon | G11C 11/5642 |

OTHER PUBLICATIONS

Sharon, et al., "Adaptive Folding for Integrated Memory Assembly," U.S. Appl. No. 16/870,930, filed May 9, 2020.

* cited by examiner

Figure 12A

|  |  | SB0/SB2 write | SB1/SB3 write | SB0/SB2 read | SB1/SB3 read |
|---|---|---|---|---|---|
| Top_SGL | TSGL0 | VSGD | VSS | VSG | VSS |
|  | TSGL1 | VSS | VSGD | VSS | VSG |
|  | TSGL2 | VSS | VSS | VSG | VSS |
|  | TSGL3 | VSS | VSS | VSS | VSG |
| Bottom_SGL | BSGL0 | VSS | VSS | VSG | VSS |
|  | BSGL1 | VSS | VSS | VSS | VSG |
|  | BSGL2 | VSGD | VSS | VSG | VSS |
|  | BSGL3 | VSS | VSGD | VSS | VSG |

Figure 12B

|  |  | SB0/SB1 write | SB2/SB3 write | SB0/SB1 read | SB2/SB3 read |
|---|---|---|---|---|---|
| Top_SGL | TSGL0 | VSGD | VSS | VSG | VSS |
|  | TSGL1 | VSGD | VSS | VSG | VSS |
|  | TSGL2 | VSS | VSGD | VSS | VSG |
|  | TSGL3 | VSS | VSGD | VSS | VSG |
| Bottom_SGL | BSGL0 | VSGD | VSS | VSG | VSS |
|  | BSGL1 | VSGD | VSS | VSG | VSS |
|  | BSGL2 | VSS | VSGD | VSS | VSG |
|  | BSGL3 | VSS | VSGD | VSS | VSG |

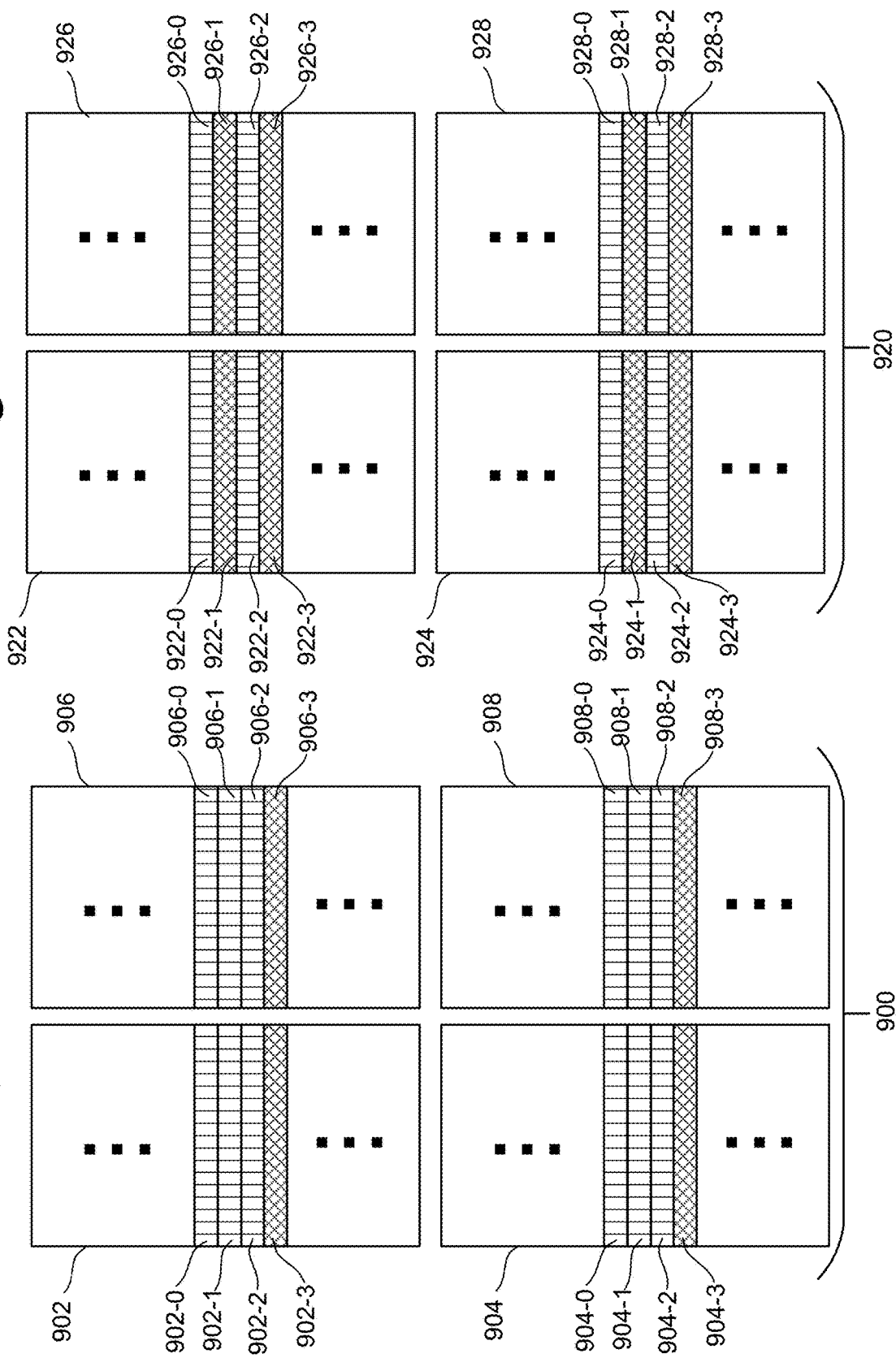

|  | S0 | S1 | S2 | S3 | S4 | S5 | S6 | S7 |
|---|---|---|---|---|---|---|---|---|
| Upper Page | 1 | 1 | 1 | 0 | 0 | 0 | 0 | 1 |
| Middle Page | 1 | 1 | 0 | 0 | 1 | 1 | 0 | 0 |
| Lower Page | 1 | 0 | 0 | 0 | 0 | 1 | 1 | 1 |

NON-VOLATILE MEMORY WITH MEMORY ARRAY BETWEEN CIRCUITS

BACKGROUND

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. Non-volatile memory allows information to be stored and retained even when the non-volatile memory is not connected to a source of power (e.g., a battery). One example of non-volatile memory is flash memory (e.g., NAND-type and NOR-type flash memory).

Users of memory systems that include non-volatile memory can write data to the non-volatile memory and later read that data back. For example, a digital camera may take a photograph and store the photograph in non-volatile memory. Later, a user of the digital camera may view the photograph by having the digital camera read the photograph from the non-volatile memory. Performance of memory systems is important to users. That is, users typically do not want to wait for the memory system to write to or read from the non-volatile memory. For example, a user of a digital camera with non-volatile memory does not want to wait for a first photograph to be stored before taking additional photographs. Therefore, there is a desire for high performance memory systems that utilize non-volatile memory.

BRIEF DESCRIPTION OF THE DRAWINGS

Like-numbered elements refer to common components in the different figures.

FIGS. 12A and 12B are tables depicting bias voltages for the top and bottom select lines.

FIG. 20 is a block diagram of a memory structure that includes four planes.

FIG. 21 is a block diagram of a memory structure that includes four planes.

DETAILED DESCRIPTION

Performance of a memory system is increased by increasing parallelism during memory operations (e.g., writing and reading). Some memory systems can include control circuits (e.g., including sense amplifiers) on the same die as the memory array, for example, underneath the memory array. Other memory systems may include control circuits (e.g., including sense amplifiers) on a different die than the memory array. In each case, the amount of parallelism (e.g., amount of data that can be written or read concurrently) is a function of the number of sense amplifiers. By including control circuits (e.g., including sense amplifiers) on the same die as the memory array and on a different die than the memory array, the number of sense amplifiers can be increased. Increasing the number of sense amplifiers increases the amount of parallelism, which results in an increase in performance of the memory system. Additionally, increasing the amount of parallelism can result in a more efficient use of power and additional functionality.

One embodiment of a memory system introduced herein includes an integrated memory assembly that comprises a memory die and a control die bonded (or otherwise connected) to the memory die. The memory die comprises a three dimensional non-volatile memory structure and a first control circuit. The three dimensional non-volatile memory structure (e.g., memory array) comprises a plurality of non-volatile memory cells. The first control circuit is positioned on a substrate of the memory die. The non-volatile memory cells are positioned directly above (e.g., on top of, but separated by one or more layers of nonconductive material, such as a dielectric) the first control circuit. The first control circuit is connected to the memory cells of the three dimensional non-volatile memory structure. The control die comprises a second control circuit that is connected to the memory cells of the three dimensional non-volatile memory structure. The first control circuit is configured to be used to perform a memory operation on a first subset of the non-volatile memory cells while the second control circuit is configured to be used to concurrently perform a memory operation on a second subset of the non-volatile memory cells.

For example, in one embodiment the first control circuit includes a first plurality of sense amplifiers connected to a first sub-block of the non-volatile memory cells and the second control circuit includes a second plurality of sense amplifiers connected to a second sub-block of the non-volatile memory cells. The first plurality of sense amplifiers and the second plurality of sense amplifiers are configured to be used to concurrently perform memory operations on the first sub-block and the second sub-block, where the first sub-block and the second sub-block are part of the same block of memory cells.

Figure 1:
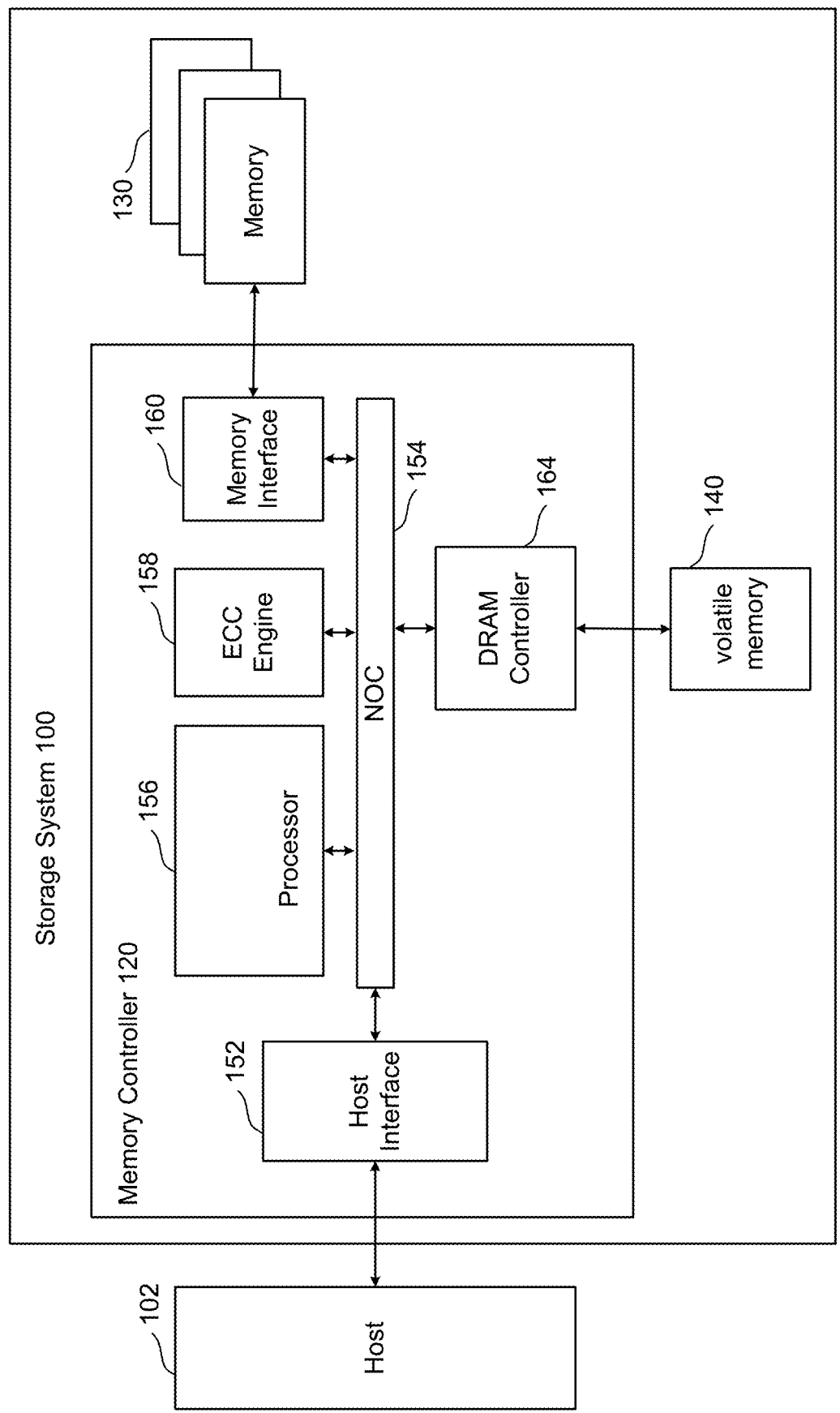
FIG. 1 is a block diagram depicting one embodiment of a memory system.

FIG. 1 is a block diagram of one embodiment of a memory system 100 that implements the technology described herein. In one embodiment, storage system 100 is a solid state drive ("SSD"). Memory system 100 can also be a memory card, USB drive, embedded memory, solid state drive or other type of storage system. The proposed technology is not limited to any one type of memory system. Memory system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, memory system 100. In other embodiments, memory system 100 is embedded within host 102.

The components of memory system 100 depicted in FIG. 1 are electrical circuits. Memory system 100 includes a memory controller 120 connected to one or more integrated memory assemblies 130 and local high speed volatile memory 140 (e.g., DRAM). The one or more integrated memory assemblies 130 each comprise a plurality of non-volatile memory cells. More information about the structure of each integrated memory assembly 130 is provided below. Local high speed volatile memory 140 is used by controller 120 to perform certain functions. For example, local high speed volatile memory 140 stores logical to physical address translation tables ("L2P tables").

Memory controller 120 comprises a host interface 152 that is connected to and in communication with host 102. In one embodiment, host interface 152 provides a PCIe interface. Other interfaces can also be used, such as SCSI, SATA, etc. Host interface 152 is also connected to a network-on-chip (NOC) 154. A NOC is a communication subsystem on an integrated circuit. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, NOC 154 can be replaced by a bus. Connected to and in communication with NOC 154 is processor 156, ECC engine 158, memory interface 160, and DRAM controller 164. DRAM controller 164 is used to operate and communicate with local high speed volatile memory 140 (e.g., DRAM). In other embodiments, local high speed volatile memory 140 can be SRAM or another type of volatile memory.

ECC engine 158 performs error correction services. For example, ECC engine 158 performs data encoding and decoding, as per the implemented ECC technique. In one embodiment, ECC engine 158 is an electrical circuit programmed by software. For example, ECC engine 158 can be a processor that can be programmed. In other embodiments, ECC engine 158 is a custom and dedicated hardware circuit without any software. In another embodiment, the function of ECC engine 158 is implemented by programming processor 156.

Processor 156 performs the various operations, such as programming, erasing, reading, as well as memory management processes. In one embodiment, processor 156 is programmed by firmware. In other embodiments, processor 156 is a custom and dedicated hardware circuit without any software. Processor 156 also implements a translation module, as a software/firmware process or as a dedicated hardware circuit. In many systems, the non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory die. To implement this system, the controller (e.g., the translation module) performs address translation between the logical addresses used by the host and the physical addresses used by the memory dies. One example implementation is to maintain tables (i.e. the L2P tables mentioned above) that identify the current translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure. In some examples, the memory space of a storage system is so large that the local memory 140 cannot hold all of the L2P tables. In such a case, the entire set of L2P tables are stored in a memory die 130 and a subset of the L2P tables are cached (L2P cache) in the local high speed volatile memory 140.

Memory interface 160 communicates with one or more integrated memory assemblies 130. In one embodiment, memory interface 160 provides a Toggle Mode interface. Other interfaces can also be used. In some example implementations, memory interface 160 (or another portion of controller 120) implements a scheduler and buffer for transmitting data to and receiving data from one or more memory die.

Figure 2:
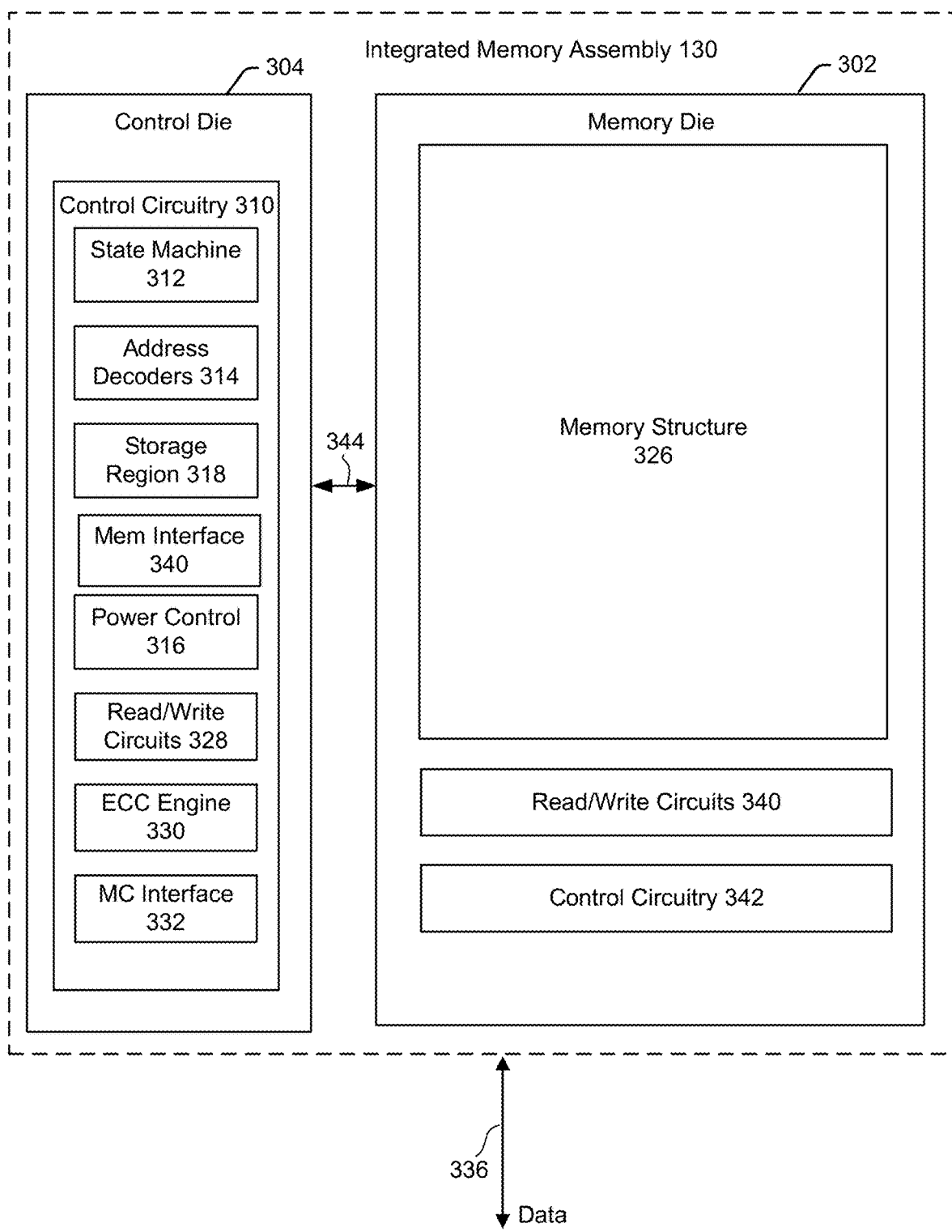
FIG. 2 is a block diagram of one embodiment of an integrated memory assembly.

FIG. 2 is a functional block diagram of one embodiment of an integrated memory assembly 130. In one embodiment, the integrated memory assembly 130 includes two semiconductor die (or more succinctly, "die"): memory die 302 and control die 304. In some embodiments, the memory die 302 and the control die 304 are directly connected or bonded together, as will be described in more detail below. For purposes of this document, the phrases directly connected and directly bonded refer to the memory die being connected/bonded to the control die with no other die between the memory die and the control die. Herein, the term, "memory die," "memory semiconductor die," or the like, means a semiconductor die that contains non-volatile memory cells for storage of data. Herein, the term, "control die," "control semiconductor die," or the like, means a semiconductor die that contains control circuitry for performing memory operations on non-volatile memory cells on a memory die.

Memory die 302 includes include memory structure 326. Memory structure 326 includes non-volatile memory cells. In one embodiment, memory structure 326 comprises a monolithic three dimensional memory array of non-volatile memory cells in which multiple memory levels are formed above a single substrate, such as a wafer. The memory structure may comprise any type of non-volatile memory that is monolithically formed in one or more physical levels of arrays of memory cells having an active area disposed above a silicon (or other type of) substrate. In one example, the non-volatile memory cells of memory structure 326 comprise vertical NAND strings with charge-trapping material such as described, for example, in U.S. Pat. No. 9,721,662, incorporated herein by reference in its entirety. A NAND string includes memory cells connected by a channel.

In another embodiment, memory structure 326 comprises a two dimensional memory array of non-volatile memory cells. In one example, the non-volatile memory cells are NAND flash memory cells utilizing floating gates such as described, for example, in U.S. Pat. No. 9,082,502, incorporated herein by reference in its entirety. Other types of memory cells (e.g., NOR-type flash memory) can also be used.

The exact type of memory array architecture or memory cell included in non-volatile memory structure 326 is not limited to the examples above. Many different types of memory array architectures or memory cell technologies can be used to form memory structure 326. No particular non-volatile memory technology is required for purposes of the new claimed embodiments proposed herein. Other examples of suitable technologies for memory cells of the memory structure 326 include ferroelectric memories (FeRAM or FeFET), ReRAM memories, magnetoresistive memory (e.g., MRAM, Spin Transfer Torque MRAM, Spin Orbit Torque MRAM), phase change memory (e.g., PCM), and the like. Examples of suitable technologies for architectures of memory structure 326 include two dimensional arrays, three dimensional arrays, cross-point arrays, stacked two dimensional arrays, vertical bit line arrays, and the like.

A person of ordinary skill in the art will recognize that the technology described herein is not limited to a single specific memory structure, but covers many relevant memory structures within the spirit and scope of the technology as described herein and as understood by one of ordinary skill in the art.

For purposes of this document, a control circuit is an electrical circuit that is used to control or manage non-volatile memory. In one embodiment, memory die 302 includes a control circuit positioned on the silicon substrate of memory die 302 and non-volatile memory structure 326 is positioned directly above the control circuit on the silicon substrate of memory die 302. Thus, the control circuit on the silicon substrate of memory die 302 is referred to as being under the memory array. In one embodiment, the control circuit on the silicon substrate of memory die 302 comprises read/write circuits 340 and control circuitry 342, both of which will be explained in more detail below.

Control die 304 includes control circuitry 310 positioned on the silicon substrate of control die 304. In one embodiment, control circuitry 310 is an example of a control circuit for memory structure 326. Control circuitry 310 comprises a set of electrical circuits that perform memory operations (e.g., program, read, erase and others) on memory structure 326. In some embodiments, "writing" refers to programming. In some embodiments, "writing" also refers to erasing. Some embodiments utilize the concept of writing without referring to programming and erasing.

Control circuitry 310 includes state machine 312, an on-chip address decoder 314, a power control circuit 316, storage region 318, read/write circuits 328, ECC engine 330, memory controller interface 332, and memory die interface 340. State machine 312 is an electrical circuit that controls the operations performed by control die 304. In some embodiments, state machine 312 is implemented by or replaced by a microprocessor, microcontroller and/or RISC processor. Storage region 318 can be volatile memory used to store software for programming a processor (e.g., the RISC processor used to implement or replace state machine 312) and for storing data (e.g., data for the decoding process and encoding process and operational parameters). In one embodiment, storage region 312 is implemented with SRAM or DRAM.

The on-chip address decoder 314 provides an address interface between addresses used by host 120 or memory controller 120 to the hardware address used by row decoders and column decoders (not expressly depicted in FIG. 2). Power control circuit 316 controls the power and voltages supplied to the word lines, bit lines, and select lines during memory operations. The power control circuit 316 includes voltage circuitry, in one embodiment. Power control circuit 316 may include charge pumps, high voltage pumps or other voltage sources for creating voltages. The power control circuit 316 executes under control of the state machine 312.

Read/write circuits 328 includes sense blocks, which may contain sense amplifiers. The sense amplifies include bit line drivers. The read/write circuits 328 execute under control of the state machine 312. Each memory structure 326 is addressable by word lines by way of a row decoder (not depicted in FIG. 2) and by bit lines by way of a column decoder (not depicted in FIG. 2).

Error correction code (ECC) engine 330 is a circuit configured to decode and error correct codewords. Herein, ECC engine 330 may be referred to as an on-die ECC engine. In one embodiment, the on-die ECC engine 330 is configured to encode data bits from memory controller 120 into codewords that contain the data bits and parity bits. The control circuitry stores the codewords in the memory structure 326. In one embodiment, the on-die ECC engine 330 is also configured to decode the codewords which are read from the memory structure 326. In some embodiments, if the on-die ECC engine 330 is successful at decoding a codeword, then the control die 304 only sends back the data bits to the memory controller 120. In some embodiments, if the on-die ECC engine 330 is not successful at decoding a codeword, then the memory controller's ECC engine may be used to decode the codeword.

In one embodiment, all or a subset of the circuits of control circuitry 310 (collectively or individually) can be considered a control circuit. The control circuit can include hardware only (e.g., electrical circuits) or a combination of hardware and software (including firmware). For example, a controller programmed by firmware is one example of a control circuit. The control circuit can include a processor, PGA (Programmable Gate Array, FPGA (Field Programmable Gate Array), ASIC (Application Specific Integrated Circuit), microcontroller, integrated circuit or other type of circuit.

Memory interface 340 is an electrical interface between control die 304 and memory doe 302, employing pathways 344. Pathways 344 are pathways between one or more components in the control circuitry 310 and the components (e.g., memory structure 326, read/write circuits 340 and control circuitry 342) on memory die 302. A portion of each pathway resides in memory die 302 and a portion of each pathway resides in control die 304. The term pathway may be used for a portion of pathways 344 that is entirely within one of the die. Thus, it may be stated that the memory die 302 has a first plurality of pathways and that the control die 304 has a second plurality of pathways such that the first plurality of pathways are directly connected to the second plurality of pathways (e.g., no intervening pathways). In one embodiment, the control die 304 and the memory die 302 are configured to transfer signals through pathway pairs of the first plurality of pathways and the second plurality of pathways. In some embodiments, the memory die 302 and the control die 304 are bonded to each other, or otherwise attached to each other, to facilitate signal transfer through the pathway pairs.

A pathway may be used to provide or receive a signal (e.g., voltage, current). A pathway includes an electrically conductive path. A pathway may include one or more of, but is not limited to, a bond pad, metal interconnect, via, transistor, electrically conducting material and other material that may transfer or carry an electrical signal. In one embodiment, pathways 344 allow the control circuitry 310 to provide voltages to word lines, select lines, and bit lines on memory die 302. Pathways 344 may be used to receive signals from, for example, bit lines. In one embodiment, there are about 100,000 pathways 344. However, there could be more or fewer than 100,000 pathways. Having such a large number of pathways 344 allows a very large amount of data, or other signals, to be passed in parallel.

Memory controller interface 332 is an electrical interface for communicating with memory controller 120. For example, memory controller interface 332 may implement a Toggle Mode Interface that connects to memory controller 120. Memory interface 340 is significantly wider than memory controller interface 332 because memory interface 340 has significantly more signals than memory controller interface 332. Therefore, more data can be sent in parallel for memory interface 340 as compared to memory controller interface 332. In some examples, memory interface 340 is 4×, 10×, 20×, or 50× wider than memory controller interface 332.

Communication channel 336 is depicted as being connected to integrated memory assembly 130 for generality. Communication channel 336 may connect to either or both of die 302 and/or 304. In one embodiment, communication channel 336 connects memory controller 120 directly to control die 304. In one embodiment, communication channel 336 connects memory controller 120 directly to memory die 302. If communication channel 336 connects memory controller 120 directly to memory die 302, then pathways 344 may be used to allow communication between memory controller 120 and control circuitry 310.

Although FIG. 2 depicts one control die 304 and one memory die 302 in an integrated memory assembly 130, there may be more than one control die 304 and more than one memory die 302 in an integrated memory assembly 130.

Figure 3:
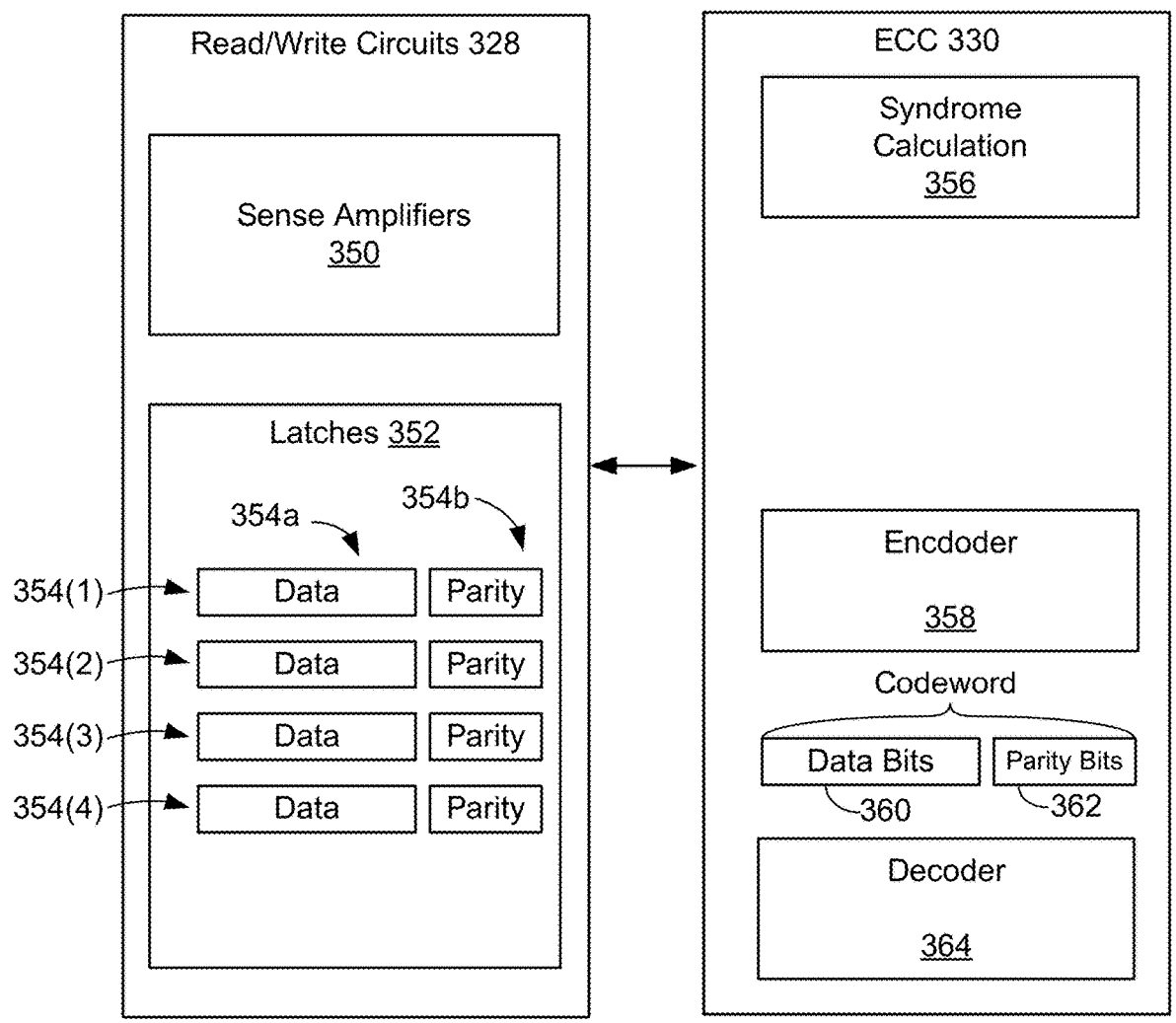
FIG. 3 is a block diagram of one embodiment of a read/write circuit and an ECC circuit of an integrated memory assembly.

FIG. 3 is a block diagram of one embodiment of the read/write circuits 328 and ECC engine 330 of the control die 304. The read/write circuits 328 have sense amplifiers 350 and latches 352. The latches 352 may include data latches 354a and parity latches 354b. In one embodiment, the data latches 354a store data bits of the codeword and the parity latches store parity bits of the codeword. It is not required that there be specific latches for data bits and for parity bits. FIG. 3 depicts four sets of data latches 354(1), 354(2), 354(3), 354(4). Each set may be used to store a codeword for a different page. In an embodiment in which four bits are stored per memory cell, four pages are stored in a set of memory cells. The four pages may be referred to as a lower page (LP), lower-middle page (LMP), upper-middle page (UMP), and an upper page (UP). In an embodiment in which three bits are stored per memory cell, three pages are stored in a set of memory cells and the four pages may be referred to as a lower page (LP), middle page (MP), and an upper page (UP).

The on-die ECC engine 330 is able to encode data bits received from memory controller 120. In one embodiment, the on-die ECC engine 330 forms codewords that each contain data bits and parity bits. In one embodiment, memory controller 120 provides the codewords to the control die 304. Control circuitry 310 stores the codewords into non-volatile memory cells in the memory structure 326. Upon a request from memory controller 120 to read data, control circuitry 310 reads codewords from memory structure 326. The on-die ECC engine 330 is also able to decode and error correct the codewords read from the memory structure 326. In some embodiments, the on-die ECC engine 330 calculates parity bits for each unit of data (e.g., page) that is being stored. The parity bits (also referred to as an error correction code or error correction information) may be stored with the unit of data (e.g., page). The combination of the unit of data and its associated parity bits are referred to as a codeword. In one embodiment, the parity bits are stored remotely from the unit of data (e.g., page).

In one embodiment, upon successfully decoding a codeword, control die 304 sends only the data bits, but not the parity bits, to memory controller 120. Therefore, bandwidth over communication lines between memory controller 120 and the integrated memory assembly 130 is saved. Also, substantial power may be saved. For example, the interface between the control die and the controller could be a high speed interface.

The on die ECC engine 330 includes syndrome calculation logic 356, an encoder 358, and a decoder 394. The encoder 380 is configured to encode data using an ECC scheme, such as a low-density parity check (LDPC) encoder, a Reed Solomon encoder, a Bose-Chaudhuri-Hocquenghem (BCH) encoder, a Turbo Code encoder, an encoder configured to encode one or more other ECC encoding schemes, or any combination thereof. The encoder 380 may form a codeword, which contains data bits 360 and parity bits 362. The data bits may be provided by memory controller 120.

Based on the bits in the latches 352, the sense amplifiers 350 may control bit line voltages in the memory structure 326 when the non-volatile memory cells are being programmed/written. In this manner, the codewords may be programmed into non-volatile memory cells in the memory structure 326. It will be appreciated that other voltages may also be applied to the memory structure 326, such applying a program voltage to memory cells that are selected for programming by a voltage generator on control die 304 applying the program voltage and boosting voltages to various word lines of memory structure 326.

Decoder 364 is configured to decode the codewords that were stored in the memory die 302. In one embodiment, sense amplifiers 350 sense bit lines in the memory structure 326 in order to read a codeword. The sense amplifiers 350 may store the read codeword into latches 352. The decoder 364 is able to detect and correct errors in the codeword. In one embodiment, the decoder 364 is a relatively low power decoder, as compared to a decoder on memory controller 120. In one embodiment, the decoder on memory controller 120 is able to correct more bit errors in the codeword than can typically be corrected by decoder 364. Thus, decoder 364 may provide a power versus error correction capability tradeoff. For example, decoder 364 may be very efficient with respect to power consumption, but at the expense of possibly not being able to correct a high number of errors in a codeword.

In some embodiments, decoder 364 is based on a sparse bipartite graph having bit (or variable) nodes and check nodes. The decoder 364 may pass messages between the bit nodes and the check nodes. Passing a message between a bit node and a check node is accomplished by performing a message passing computation. The message passing computation may be based on belief propagation.

Syndrome calculation logic 356 (e.g., an electrical circuit and/or software) is able to determine a syndrome weight for codewords. The syndrome weight refers to the number of parity check equations that are unsatisfied. The initial syndrome weight of a codeword may correlate with the bit error rate (BER) of that codeword. Thus, the control die 304 may estimate a BER for a codeword based on the initial syndrome weight. In one embodiment, the syndrome logic is implemented in hardware. The syndrome weight can be determined without fully decoding a codeword. Hence, the initial syndrome weight can be calculated in less time and with less power than for decoding a codeword. In some embodiments, control die 304 makes management decisions based on the estimated BER. For example, control die 304 may determine what technique should be used to decode a codeword, what read reference voltages should be used to read memory cells, etc. based on the estimated BER.

Figure 4:
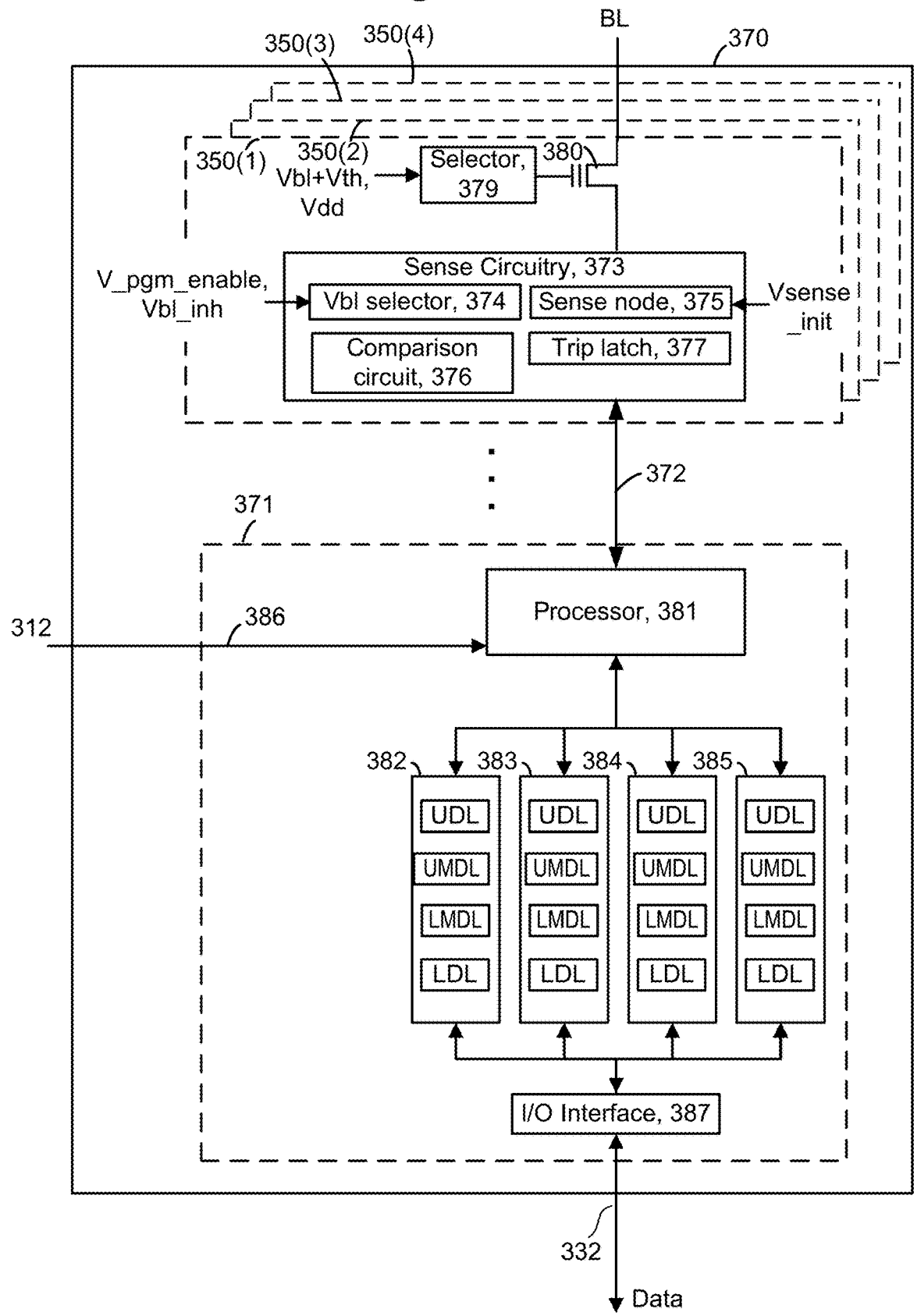
FIG. 4 is a block diagram depicting one embodiment of a sense block.

FIG. 4 is a block diagram depicting one embodiment of a sense block 370, which is part of the read/write circuits 328. An individual sense block 450 is partitioned into one or more core portions, referred to as sense circuits or sense amplifiers 350(1)-350(4), and a common portion, referred to as a managing circuit 371. In one embodiment, there will be a separate sense circuit for each bit line/NAND string and one common managing circuit 371 for a set of multiple, e.g., four or eight, sense circuits. Each of the sense circuits in a group communicates with the associated managing circuit by way of data bus 372. Thus, there are one or more managing circuits which communicate with the sense circuits of a set of storage elements (memory cells).

The sense amplifier 350(1), as an example, comprises sense circuitry 373 that performs sensing by determining whether a conduction current in a connected bit line is above or below a predetermined threshold level. The sensing can occur in a read or verify operation. The sense circuit also supplies a bit line voltage during the application of a program voltage in a program operation (e.g., write operation).

The sense circuitry 373 may include a Vbl selector 374, a sense node 375, a comparison circuit 376 and a trip latch 377. During the application of a program voltage, the Vbl selector 374 can pass a program enable voltage (e.g., V_pgm_enable) or a program-inhibit voltage (e.g., Vbl_inh) to a bit line connected to a memory cell. The Vbl selector 374 can also be used during sensing operations. Herein, a "program enable voltage" is defined as a voltage applied to a memory cell that enables programming of the memory cell while a program voltage (e.g., Vpgm) is also applied to the memory cell. In certain embodiments, a program enable voltage is applied to a bit line coupled to the memory cell while a program voltage is applied to a control gate of the memory cell. Herein, a "program inhibit voltage" is defined as a voltage applied to a bit line coupled to a memory cell to inhibit programming of the memory cell while a program voltage (e.g., Vpgm) is also applied to the memory cell (e.g., applied to the control gate of the memory cell). Note that boosting voltages (e.g., Vpass) may be applied to unselected word lines along with the program inhibit voltage applied to the bit line. The bit lines are part of memory structure 326 on memory die 302.

Program inhibit voltages are applied to bit lines coupled to memory cells that are not to be programmed and/or bit lines having memory cells that have reached their respective target threshold voltage through execution of a programming process. These may be referred to as "unselected bit lines." Program inhibit voltages are not applied to bit lines ("selected bit lines") having a memory cell to be programmed. When a program inhibit voltage is applied to an unselected bit line, the bit line is cut off from the NAND channel, in one embodiment. Hence, the program inhibit voltage is not passed to the NAND channel, in one embodiment. Boosting voltages are applied to unselected word lines to raise the potential of the NAND channel, which inhibits programming of a memory cell that receives the program voltage at its control gate.

A transistor 380 (e.g., an nMOS) can be configured as a pass gate to pass Vbl from the Vbl selector 374, by setting the control gate voltage of the transistor sufficiently high, e.g., higher than the Vbl passed from the Vbl selector. For example, a selector 379 may pass a power supply voltage Vdd, e.g., 3-4 V to the control gate of the transistor 380.

The sense amplifier 350(1) is configured to control the timing of when the voltages are applied to the bit line. During sensing operations such as read and verify operations, the bit line voltage is set by the transistor 380 based on the voltage passed by the selector 379. The bit line voltage is roughly equal to the control gate voltage of the transistor minus its Vt (e.g., 3 V). For example, if Vbl+Vt is passed by the selector 379, the bit line voltage will be Vbl. This assumes the source line is at 0 V. The transistor 380 clamps the bit line voltage according to the control gate voltage and acts as a source-follower rather than a pass gate. The Vbl selector 374 may pass a relatively high voltage such as Vdd which is higher than the control gate voltage on the transistor 380 to provide the source-follower mode. During sensing, the transistor 380 thus charges up the bit line.

In one approach, the selector 379 of each sense amplifier can be controlled separately from the selectors of other sense amplifiers, to pass Vbl or Vdd. The Vbl selector 462 of each sense amplifier can also be controlled separately from the Vbl selectors of other sense amplifiers.

During sensing, the sense node 375 is charged up to an initial voltage such as Vsense_init=3 V. The sense node is then connected to the bit line by way of the transistor 380, and an amount of decay of the sense node is used to determine whether a memory cell is in a conductive or non-conductive state. In one embodiment, a current that flows in the bot line discharges the sense node (e.g., sense capacitor). The length of time that the sense node is allowed to decay may be referred to herein as an "integration time." The comparison circuit 466 is used to compare the sense node voltage to a trip voltage at a sense time. If the sense node voltage decays below the trip voltage Vtrip, the memory cell is in a conductive state and its Vt is at or below the voltage of the verification signal. If the sense node voltage does not decay below Vtrip, the memory cell is in a non-conductive state and its Vt is above the voltage of the verification signal. The sense amplifier 350(1) includes a trip latch 468 that is set by the comparison circuit 466 based on whether the memory cell is in a conductive or non-conductive state. The data in the trip latch can be a bit which is read out by the processor 381.

The managing circuit 371 comprises a processor 381, four example sets of data latches 382, 383, 384, 385 and an I/O Interface 387 coupled between the sets of data latches and data bus 332 (data bus may connect to memory controller 102). One set of data latches, e.g., comprising individual latches LDL, LMDL, UMDL, and UDL, can be provided for each sense amplifier. In some cases, fewer or additional data latches may be used. LDL stores a bit for a lower page of data, LMDL stores a bit for a lower-middle page of data, UMDL stores a bit for an upper-middle page of data, and UDL stores a bit for an upper page of data. This is in a sixteen level or four bits per memory cell memory device. In one embodiment, there are eight levels or three bits per memory cell and, therefore, only three latches (LDL, MDL, UDL) per sense amplifier.

The processor 381 performs computations, such as to determine the data stored in the sensed memory cell and store the determined data in the set of data latches. Each set of data latches 382-385 is used to store data bits determined by processor 381 during a read operation, and to store data bits imported from the data bus 332 during a program operation which represent write data meant to be programmed into the memory. I/O interface 488 provides an interface between data latches 382-385 and the data bus 332.

The processor 381 may also be used to determine what voltage to apply to the bit line, based on the state of the latches.

During reading, the operation of the system is under the control of state machine 312 that controls the supply of different control gate voltages to the addressed memory cell (e.g., by applying voltages from power control 316 to word lines on the memory structure 326 by way of the pathways between control die 304 and memory die 302 discussed herein). As it steps through the various predefined control gate voltages corresponding to the various memory states supported by the memory, the sense circuit may trip at one of these voltages and a corresponding output will be provided from sense circuit to processor 482 by way of the data bus 454. At that point, processor 482 determines the resultant memory state by consideration of the tripping event(s) of the sense circuit and the information about the applied control gate voltage from the state machine by way of input lines 490. It then computes a binary encoding for the memory state and stores the resultant data bits into data latches 484-487.

Some implementations can include multiple processors 381. In one embodiment, each processor 381 will include an output line (not depicted) such that each of the output lines is wired-OR'd together. In some embodiments, the output lines are inverted prior to being connected to the wired-OR line. This configuration enables a quick determination during a program verify test of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because (in one embodiment) each processor communicates with four sense amplifiers, the state machine needs to read the wired-OR line four times, or logic is added to processor 381 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations for memory cells, the data to be programmed (write data) is stored in the set of data latches 382-385 from the data bus 332, in the LDL, LMDL, UMDL, and UDL latches, in a four-bit per memory cell implementation.

The program operation, under the control of the state machine, applies a set of programming voltage pulses to the control gates of the addressed memory cells. Each voltage pulse may be stepped up in magnitude from a previous program pulse by a step size in a process referred to as incremental step pulse programming. Each program voltage is followed by a verify operation to determine if the memory cells has been programmed to the desired memory state. In some cases, processor 381 monitors the read back memory state relative to the desired memory state. When the two are in agreement, the processor 381 sets the bit line in a program inhibit mode such as by updating its latches. This inhibits the memory cell coupled to the bit line from further programming even if additional program pulses are applied to its control gate.

Each set of data latches 382-385 may be implemented as a stack of data latches for each sense amplifier. In one embodiment, there are three data latches per sense amplifier 350. In some implementations, the data latches are implemented as a shift register so that the parallel data stored therein is converted to serial data for data bus 332, and vice versa. All the data latches corresponding to the read/write block of memory cells can be linked together to form a block shift register so that a block of data can be input or output by serial transfer. In particular, the bank of read/write circuits is adapted so that each of its set of data latches will shift data in to or out of the data bus in sequence as if they are part of a shift register for the entire read/write block.

The data latches identify when an associated memory cell has reached certain milestones in a program operation. For example, latches may identify that a memory cell's Vt is below a particular verify voltage. The data latches indicate whether a memory cell currently stores one or more bits from a page of data. For example, the LDL latches can be used to store a lower page of data. An LDL latch is flipped (e.g., from 0 to 1) when a lower page bit is stored in an associated memory cell. An LMDL, UMDL or UDL latch is flipped when a lower-middle, upper-middle or upper page bit, respectively, is stored in an associated memory cell. This occurs when an associated memory cell completes programming.

In one embodiment, memory structure 326 includes a plurality non-volatile memory cells arranged as vertical NAND strings. For example, the memory structure may include a stack of alternating dielectric layers and conductive layers, with memory holes formed in the stack. NAND strings are formed by filling the memory holes with materials including a charge-trapping material to create a vertical column of memory cells. Each memory cell can store one or more bits of data. More details of the three dimensional monolithic memory array that comprises memory structure 326 is provided below with respect to FIGS. 4-12.

Figure 5:
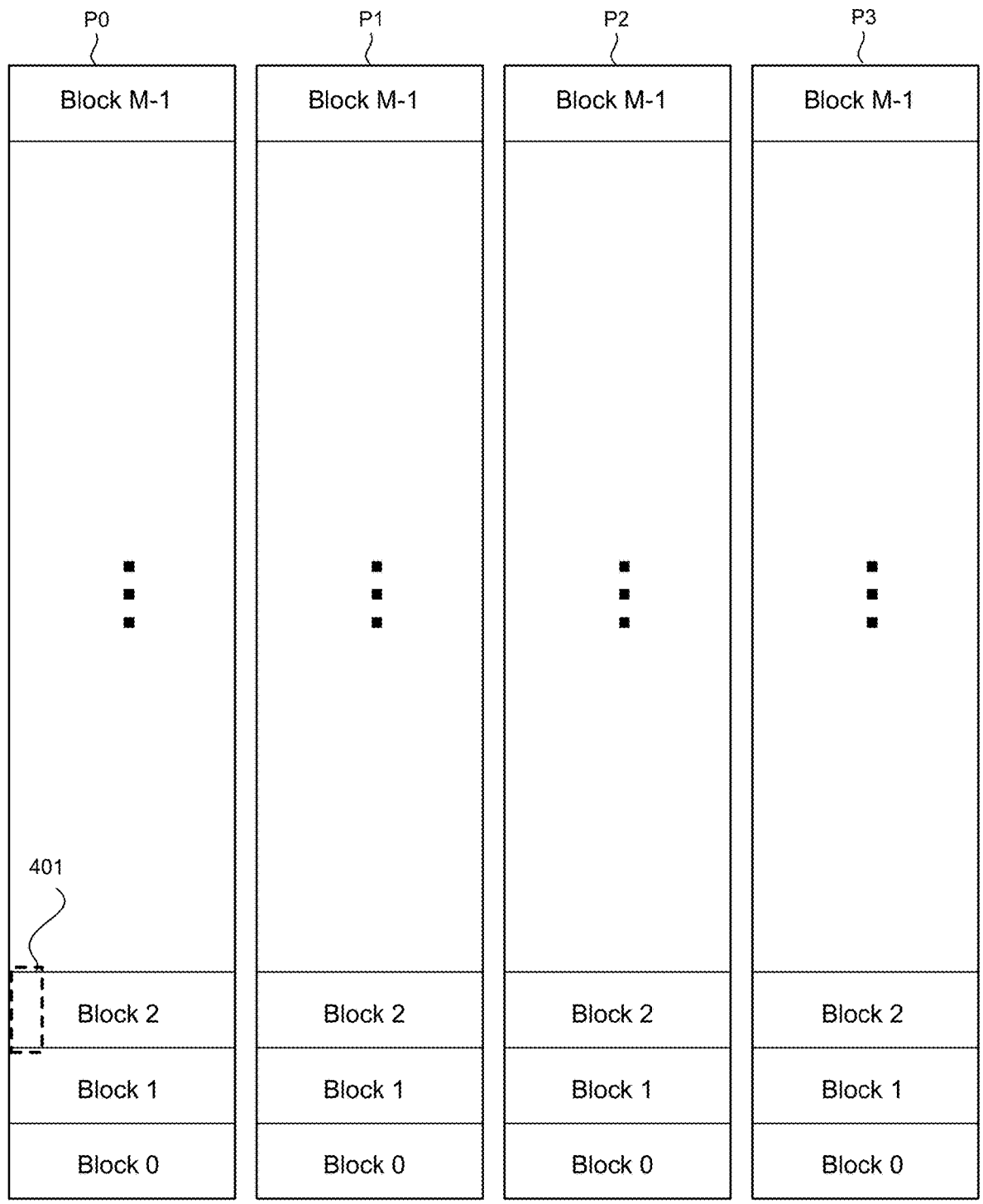
FIG. 5 is a block diagram of a memory structure that includes four planes.

FIG. 5 is a block diagram explaining one example organization of memory structure 326, which is divided into four planes P0. P1, P2 and P3. Each plane is then divided into M blocks. In one example, each plane has about 2000 blocks. However, different numbers of blocks and planes can also be used. In on embodiment, a block of memory cells is a unit of erase. That is, all memory cells of a block are erased together. Therefore, a block may also be referred to as an erase block. In other embodiments, memory cells can be grouped into blocks for other reasons, such as to organize the memory structure 326 to enable the signaling and selection circuits. In some embodiments, a block represents a groups of connected memory cells as the memory cells of a block share a common set of word lines.

Figure 6:
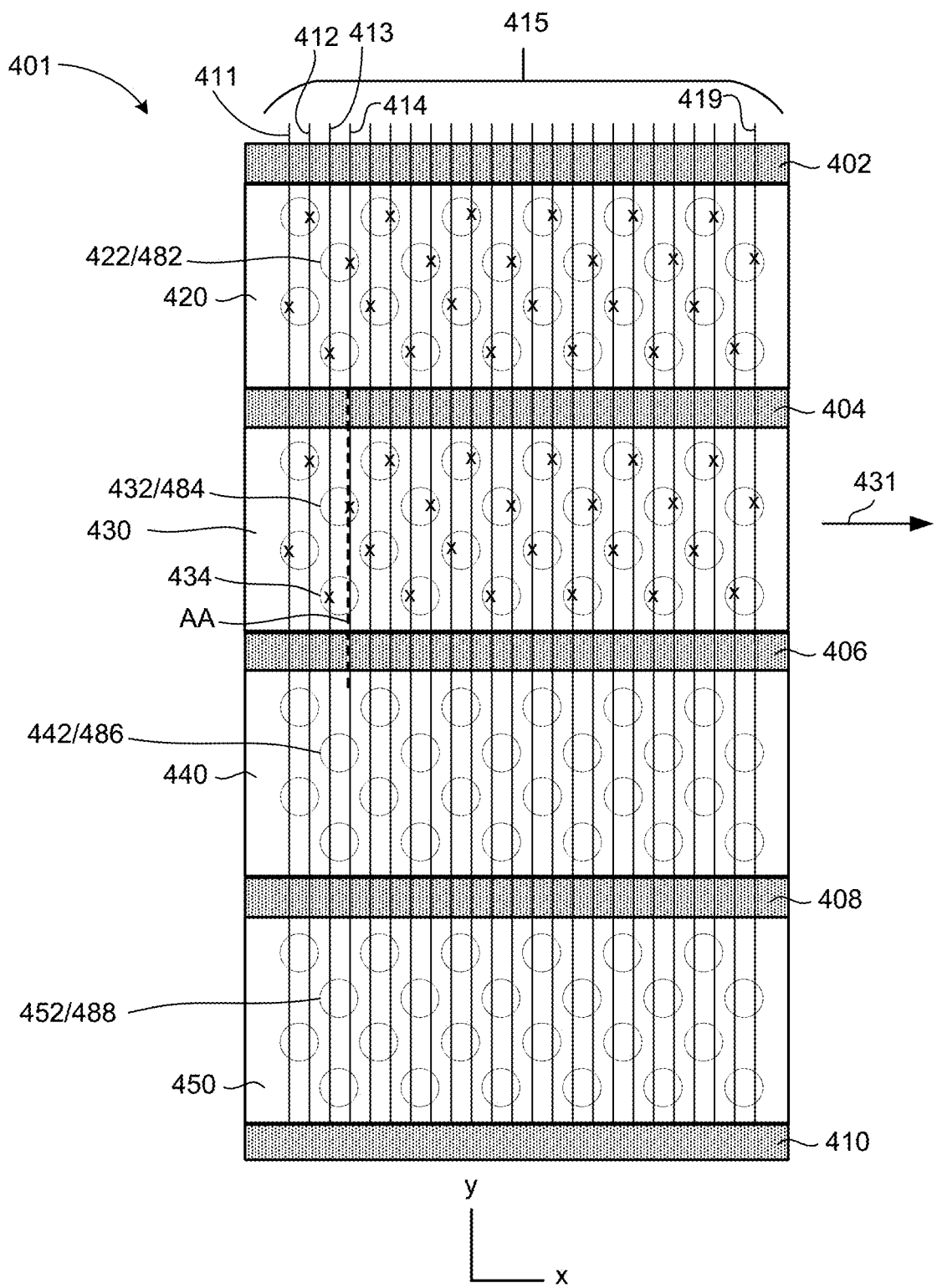
FIG. 6 depicts a top view of a portion of a block of memory cells.

FIGS. 6-9 depict an example three dimensional ("3D") NAND structure that can be used to implement memory structure 326. FIG. 6 is a block diagram depicting a top view of a portion of one block from memory structure 326. The portion of the block depicted in FIG. 6 corresponds to portion 401 in Block 2 of FIG. 5. As can be seen from FIG. 6, the block depicted in FIG. 6 extends in the direction of 431. In one embodiment, the memory array has many layers; however, FIG. 6 only shows the top layer.

FIG. 6 depicts a plurality of circles that represent the vertical columns. Each of the vertical columns include multiple select transistors (also referred to as a select gate or selection gate) and multiple memory cells. In one embodiment, each vertical column implements a NAND string. For example, FIG. 6 depicts vertical columns 422, 432, 442 and 452. Vertical column 422 implements NAND string 482. Vertical column 432 implements NAND string 484. Vertical column 442 implements NAND string 486. Vertical column 452 implements NAND string 488. More details of the vertical columns are provided below. Since the block depicted in FIG. 6 extends in the direction of arrow 431, the block includes more vertical columns than depicted in FIG. 6.

FIG. 6 also depicts a set of bit lines 415, including bit lines 411, 412, 413, 414, . . . 419. FIG. 6 shows twenty four bit lines because only a portion of the block is depicted. It is contemplated that more than twenty four bit lines connected to vertical columns of the block. Some of the circles representing vertical columns has an "x" to indicate its connection to one bit line. For example, bit line 414 is connected to vertical columns 422 and 432. The block depicted in FIG. 6 includes a set of full slits 402 and 410 that are etched from the top of the vertical columns to the bottom of the vertical columns, and filled with oxide. Partial slits 404, 406, and 408 are etched through the top of layers to divide the select lines, as described below, in order to divide each layer of the block into four regions (420, 430, 440, and 450) that are referred to as sub-blocks (and will be discussed in more detail below). In one example implementation, a bit line only connects to (at most) one vertical column in each of sub-blocks 420, 430, 440 and 450. In that implementation, each block has sixteen rows of active columns and each bit line connects to two rows in each block. In one embodiment, all of two rows connected to a common bit line are connected to the same word line but different select lines; therefore, the system uses the source side selection lines and the drain side selection lines to choose one (or another subset) of the four to be subjected to a memory operation. Although FIG. 6 shows each region having four rows of vertical columns, four regions and sixteen rows of vertical columns in a block, those exact numbers are an example implementation. Other embodiments may include more or less regions per block, more or less rows of vertical columns per region and more or less rows of vertical columns per block. FIG. 6 also shows the vertical columns being staggered. In other embodiments, different patterns of staggering can be used. In some embodiments, the vertical columns are not staggered.

Figure 7:
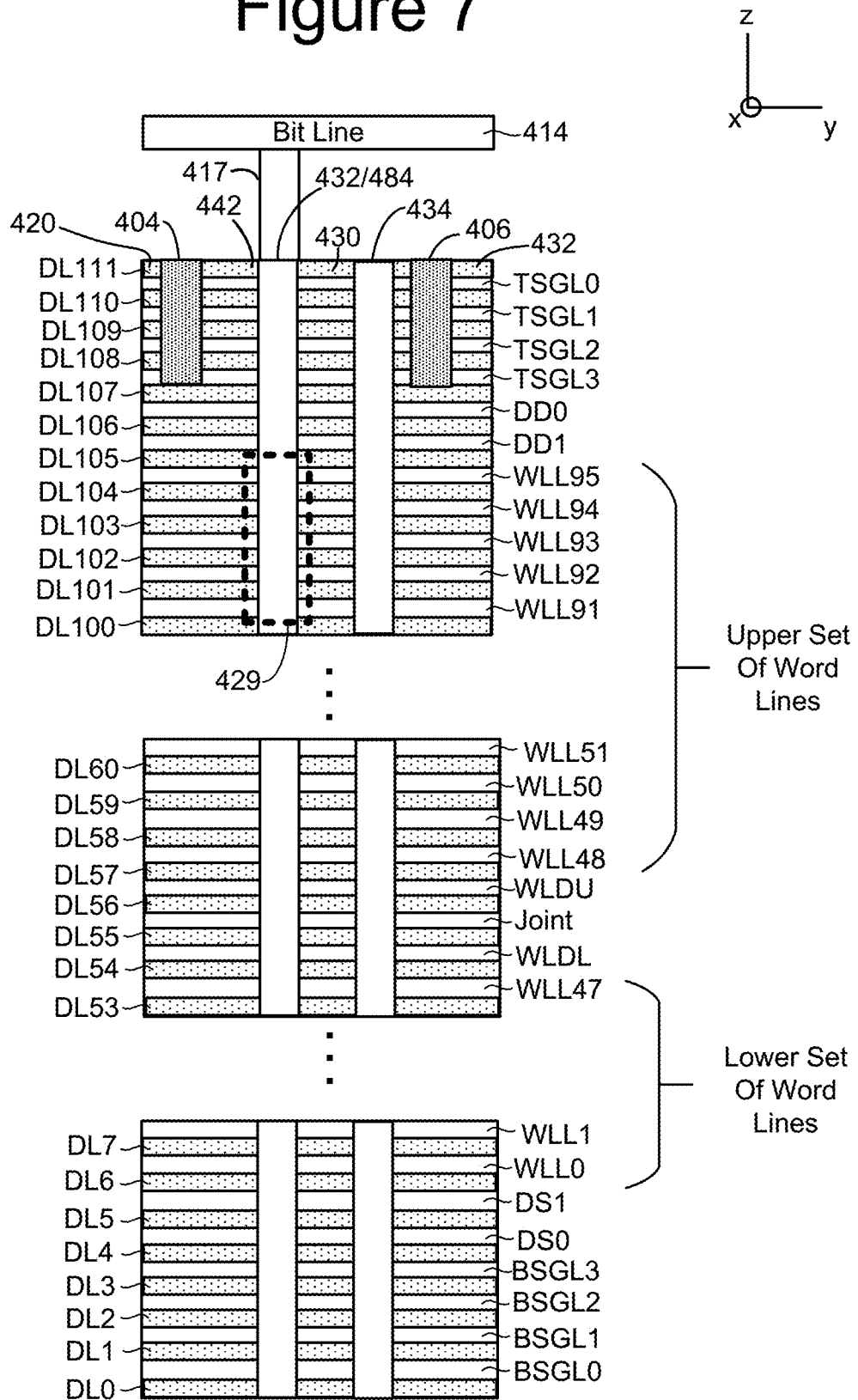
FIG. 7 depicts a cross sectional view of a portion of a block of memory cells.

FIG. 7 depicts a portion of one embodiment of a three dimensional memory structure 326 showing a cross-sectional view along line AA of FIG. 6. This cross sectional view cuts through vertical columns 432 and 434 and region/sub-block 430 (see FIG. 6). The structure of FIG. 7 includes four top side select layers TSGL0, TSGL1, TSGL2 and TSGL3; four bottom side select layers BSGL0, BSGL1, BSGL2 and BSGL3; six dummy word line layers DD0, DD1, DS0, DS1, WLDL, WLDU; and ninety six data word line layers WLL0-WLL95 for connecting to data memory cells. Other embodiments can implement more or less than four top side side select layers, more or less than four bottom side select layers, more or less than six dummy word line layers, and more or less than ninety six word lines. Vertical columns 432 and 434 are depicted protruding through the top side select layers, source side select layers, dummy word line layers and word line layers. In one embodiment, each vertical column comprises a vertical NAND string. For example, vertical column 432 comprises NAND string 484. Directly below the vertical columns and the layers listed below is a control circuit (not depicted in FIG. 7), and directly below the control circuit is a substrate (not depicted), For purposes of this document, the phrase "directly below" means underneath rather than to the side. The NAND string of vertical column 432 has a source end at a bottom of the stack and a drain end at a top of the stack. As in agreement with FIG. 6, FIG. 6 shows vertical column 432 connected to Bit Line 414 via connector 417. Local interconnects 404 and 406 are also depicted.

For ease of reference, top side select layers TSGL0, TSGL1, TSGL2 and TSGL3; bottom side select layers BSGL0, BSGL1, BSGL2 and BSGL3; dummy word line layers DD0, DD1, DS0, DS1, WLDL and WLDU; and word line layers WLL0-WLL95 collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials. Between conductive layers are dielectric layers DL0-DL111. For example, dielectric layers DL104 is above word line layer WLL94 and below word line layer WLL95. In one embodiment, the dielectric layers are made from $SiO_2$. In other embodiments, other dielectric materials can be used to form the dielectric layers.

The non-volatile memory cells are formed along vertical columns which extend through alternating conductive and dielectric layers in the stack. In one embodiment, the memory cells are arranged in NAND strings. The word line layers WLL0-WLL95 connect to memory cells (also called data memory cells). Dummy word line layers DD0, DD1, DS0, DS1, WLDL and WLDU connect to dummy memory cells. A dummy memory cell does not store and is not eligible to store host data (data provided from the host, such as data from a user of the host), while a data memory cell is eligible to store host data. In some embodiments, data memory cells and dummy memory cells may have a same structure. A dummy word line is connected to dummy memory cells. Top side select layers TSGL0, TSGL1, TSGL2 and TSGL3 are used to electrically connect and disconnect NAND strings from bit lines or source lines (as discussed below). Bottom side select layers BSGL0, BSGL1, BSGL2 and BSGL3 are used to electrically connect and disconnect NAND strings from source lines or bit lines (as discussed below).

FIG. 7 also shows a Joint area. In one embodiment it is expensive and/or challenging to etch ninety six word line layers intermixed with dielectric layers. To ease this burden, one embodiment includes laying down a first stack of forty eight word line layers alternating with dielectric layers, laying down the Joint area, and laying down a second stack of forty eight word line layers alternating with dielectric layers. The Joint area is positioned between the first stack and the second stack. The Joint area is used to connect to the first stack to the second stack. In FIG. 7, the first stack is labeled as the "Lower Set of Word Lines" and the second stack is labeled as the "Upper Set of Word Lines." In one embodiment, the Joint area is made from the same materials as the word line layers. In one example set of implementations, the plurality of word lines (control lines) comprises a first stack of alternating word line layers and dielectric layers, a second stack of alternating word line layers and dielectric layers, and a joint area between the first stack and the second stack, as depicted in FIG. 7.

Figure 8:
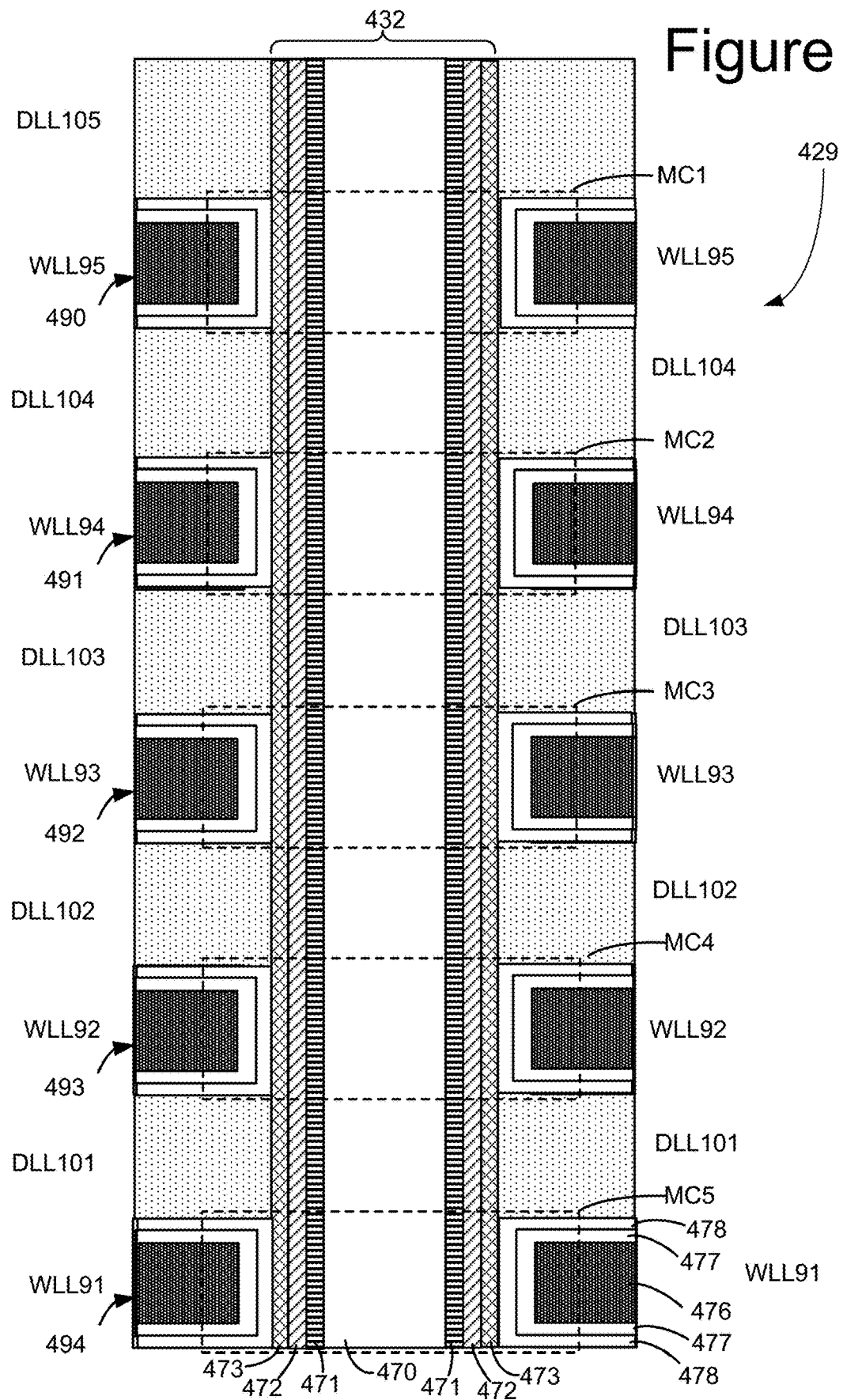
FIG. 8 is a cross sectional view of a vertical column of memory cells.

FIG. 8 depicts a cross sectional view of region 429 of FIG. 7 that includes a portion of vertical column 432 (a memory hole). In one embodiment, the vertical columns are round; however, in other embodiments other shapes can be used. In one embodiment, vertical column 432 includes an inner core layer 470 that is made of a dielectric, such as $SiO_2$. Other materials can also be used. Surrounding inner core 470 is polysilicon channel 471. Materials other than polysilicon can also be used. Note that it is the channel 471 that connects to the bit line and the source line. Surrounding channel 471 is a tunneling dielectric 472. In one embodiment, tunneling dielectric 472 has an ONO structure. Surrounding tunneling dielectric 472 is charge trapping layer 473, such as (for example) Silicon Nitride. Other memory materials and structures can also be used. The technology described herein is not limited to any particular material or structure.

FIG. 8 depicts dielectric layers DLL105, DLL104, DLL103, DLL102 and DLL101, as well as word line layers WLL95, WLL94, WLL93, WLL92, and WLL91. Each of the word line layers includes a word line region 476 surrounded by an aluminum oxide layer 477, which is surrounded by a blocking oxide layer 478. In other embodiments, the blocking oxide layer can be a vertical layer parallel and adjacent to charge trapping layer 473. The physical interaction of the word line layers with the vertical column forms the memory cells. Thus, a memory cell, in one embodiment, comprises channel 471, tunneling dielectric 472, charge trapping layer 473, blocking oxide layer 478, aluminum oxide layer 477 and word line region 476. For example, word line layer WLL95 and a portion of vertical column 432 comprise a memory cell MC1. Word line layer WLL94 and a portion of vertical column 432 comprise a memory cell MC2. Word line layer WLL93 and a portion of vertical column 432 comprise a memory cell MC3. Word line layer WLL92 and a portion of vertical column 432 comprise a memory cell MC4. Word line layer WLL91 and a portion of vertical column 432 comprise a memory cell MC5. In other architectures, a memory cell may have a different structure; however, the memory cell would still be the storage unit.

When a memory cell is programmed, electrons are stored in a portion of the charge trapping layer 473 which is associated with the memory cell. These electrons are drawn into the charge trapping layer 473 from the channel 471, through the tunneling dielectric 472, in response to an appropriate voltage on word line region 476. The threshold voltage (Vth) of a memory cell is increased in proportion to the amount of stored charge. In one embodiment, the programming is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as gate induced drain leakage (GIDL).

Figure 9:
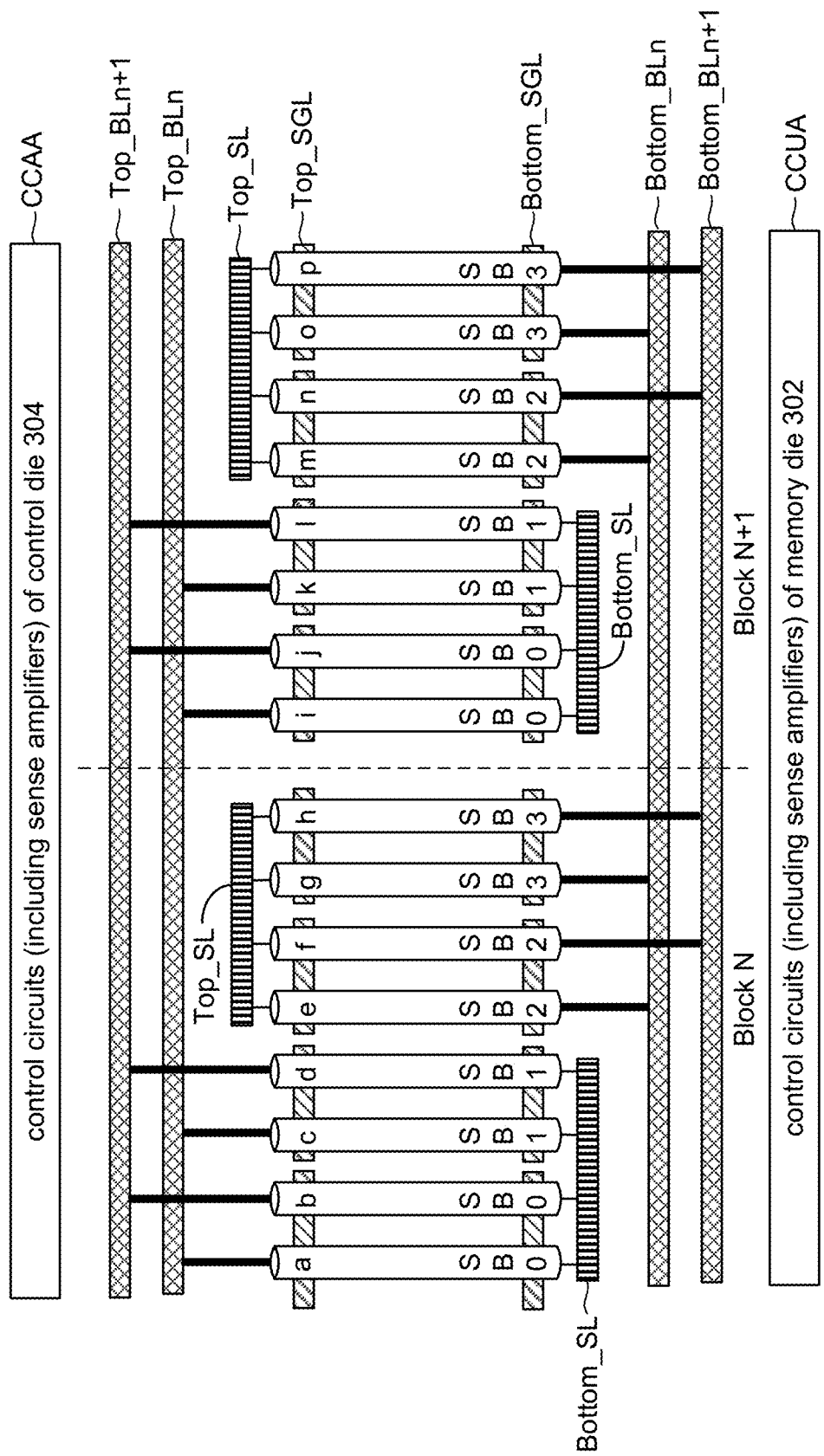
FIG. 9 is a cross sectional view of one embodiment of a portion of two blocks of memory cells.

As discussed above, the integrated memory assembly includes a first control circuit on the memory die (underneath memory structure 326) and a second control circuit on the control die such that the first control circuit is configured to be used to perform a memory operation on a first subset of the non-volatile memory cells (e.g., first sub-block) while the second control circuit is configured to be used to concurrently perform the same memory operation on a second subset of the non-volatile memory cells (e.g., second sub-block of same block). FIG. 9 is a cross sectional view of one embodiment of a portion of two blocks of memory cells (Block N and Block N+1) of memory structure 326 that better explain how the various memory holes/NAND strings are connected to the bit lines and source lines to enable the first control circuit to perform a memory operation on a first subset of the non-volatile memory cells while the second control circuit concurrently performs a memory operation on a second subset of the non-volatile memory cells. In one embodiment, each block is divided into four sub-blocks SB0, SB1, SB2 and SB3. Sub-block SB0 corresponds to those vertical NAND strings controlled by TSGL0 and BSGL0, sub-block SB1 corresponds to those vertical NAND strings controlled by TSGL1 and BSGL1, sub-block SB2 corresponds to those vertical NAND strings controlled by TSGL2 and BSGL2, and sub-block SB3 corresponds to those vertical NAND strings controlled by TSGL3 and BSGL3. For example purposes, and to make the drawing easier to read, FIG. 9 shows two memory holes/NAND strings for each sub-block (SB0, SB1, SB2, SB3) of Block N and Block N+1; however, in most embodiments each sub-block will include more than two memory holes/NAND strings.

Memory structure 326 includes bit lines above memory structure 326 and below memory structure 326. For example, bit lines Top_BLn and Top_BLn+1 are above memory structure 326, while bit lines Bottom_BLn and Bottom_BLn+1 are below memory structure 326. It is contemplated that there will be more than two bit lines above memory structure 326 and more than two bit lines below memory structure 326; however, FIG. 9 only shows two to make the drawing easier to read. In one embodiment, the top bit lines are connected to the control circuit (including sense amplifiers) of control die 304 (CCAA) and the bottom bit lines are connected to the control circuit (including sense amplifiers) of memory die 302 (CCUA). In the implementation depicted in FIG. 9, NAND strings of sub-blocks SB0 and SB1 are connected to bit lines above the memory structure and, thereby, to the sense amplifiers of control die 304 (CCAA), while NAND strings of sub-blocks SB2 and SB3 are connected to bit lines below the memory structure and, thereby, to the sense amplifiers of memory die 302 (CCUA). For example, NAND string a of sub-block SB0 is connected to Top_BLn, NAND string b of sub-block SB0 is connected to Top_BLn+1, NAND string c of sub-block SB1 is connected to Top_BLn, NAND string d of sub-block SB1 is connected to Top_BLn+1, NAND string e of sub-block SB2 is connected to Bottom_BLn, NAND string f of sub-block SB2 is connected to Bottom_BLn+1, NAND string g of sub-block SB3 is connected to Bottom_BLn, NAND string h of sub-block SB3 is connected to Bottom_BLn+1, NAND string i of sub-block SB0 is connected to Top_BLn, NAND string j of sub-block SB0 is connected to Top_BLn+1, NAND string k of sub-block SB1 is connected to Top_BLn, NAND string l of sub-block SB1 is connected to Top_BLn+1, NAND string m of sub-block SB2 is connected to Bottom_BLn, NAND string n of sub-block SB2 is connected to Bottom_BLn+1, NAND string o of sub-block SB3 is connected to Bottom_BLn, and NAND string p of sub-block SB3 is connected to Bottom_BLn+1.

Memory structure 326 includes a source line (Top_SL) above memory structure 326 and a source line (Bottom_SL) below memory structure 326. The source lines are shown as divided into individual and separate non-continuous sections. Each of the individual sections of source line Top_SL are connected together (e.g., shorted together or routed to a common connection). Each of the individual sections of source line Bottom_SL are connected together (e.g., shorted together or routed to a common connection). In one embodiment, Top_SL and Bottom_SL are both connected to the control circuit of control die 304. In another embodiment, Top_SL and Bottom_SL are both connected to the control circuit of memory die 302. In another embodiment, Top_SL is connected to the control circuit of control die 304 and Bottom_SL is connected to the control circuit of memory die 302.

In the arrangement of FIG. 9, a memory operation can be performed on NAND strings of sub-block SB0 (e.g., NAND strings a and b) via sense amplifiers on control die 304 (CCAA) while the memory operation is concurrently performed on NAND strings of sub-block SB2 (e.g., NAND strings e and f) via sense amplifiers on memory die 302 (CCUA); a memory operation can be performed on NAND strings of sub-block SB0 (e.g., NAND strings a and b) via sense amplifiers on control die 304 while a memory operation is concurrently performed on NAND strings of sub-block SB3 (e.g., NAND strings g and h) via sense amplifiers on memory die 302; a memory operation can be performed on NAND strings of sub-block SB1 (e.g., NAND strings c and d) via sense amplifiers on control die 304 while a memory operation is concurrently performed on NAND strings of sub-block SB2 (e.g., NAND strings e and f) via sense amplifiers on memory die 302; and a memory operation can be performed on NAND strings of sub-block SB1 (e.g., NAND strings c and d) via sense amplifiers on control die 304 while a memory operation is concurrently performed on NAND strings of sub-block SB3 (e.g., NAND strings g and h) via sense amplifiers on memory die 302.

In one example, the memory system can write a first page of data (e.g., 16 KB) to SB0 or SB1 via sense amplifiers on control die 304 while concurrently writing a second page of data to SB2 or SB3 via sense amplifiers on memory die 302, thus doubling the level of parallelism which results in an increase in speed/performance of the memory system. Similarly, the memory system can read a first page of data (e.g., 16 KB) from SB0 or SB1 via sense amplifiers on control die 304 while concurrently reading a second page of data to SB2 or SB3 via sense amplifiers on memory die 302, thus doubling the level of parallelism which results in an increase in speed/performance of the memory system. Additionally, since all of the memory cells of the two sub-blocks experiencing a memory operation are connected to the same word line, the word line voltage (e.g., power) is being used more efficiently. That is the same word line voltage will be used to write to twice as many memory cells or read from twice as many memory cells. Prior memory systems could not achieve this level of parallelism because there was not enough room on a single die for enough sense amplifiers.

For purposes of this document, the term "concurrently" includes overlapping in time, even if they start or stop at different times. Note that FIG. 9 shows Top_BLn+1, Top_BLn, Top_SL and CCAA above the memory structure, while Bottom_BLn, Bottom_BLn+1, Bottom_SL and CCUA are below the memory structure. The terms above and below are used relative to the memory structure 326 and the substrate of memory die 302 such that anything between memory structure 326 and the substrate of memory die 302 is considered below the memory structure and anything that is on the opposite side of the memory structure than the substrate of memory die 302 is considered above the memory structure, regardless of the orientation of the integrated memory assembly.

FIG. 9 shows top side selection line Top_SGL, which represents top side selection lines TSGL0, TSGL1, TSGL2 and TSGL3; therefore, FIG. 9 depicts Top_SGL as four unconnected metal lines (with the same shading). FIG. 9 also shows bottom side selection line Bottom_SGL, which represents bottom side selection lines BSGL0, BSGL1, BSGL2 and BSGL3; therefore, FIG. 9 depicts Bottom_SGL as four unconnected metal lines (with the same shading). For NAND strings of sub-blocks SB0 and SB1 (e.g., a, b, c, d, i, j, k, l), Top_SGL operates as a drain side select line and Bottom_SGL operates as a source side select line; therefore, the select gates connected to Top_SGL are drain side select gates and the select gates connected to Bottom_SGL are source side select gates. For NAND strings of sub-blocks SB2 and SB3 (e.g., e, f, g, h, m, n, o, p), Top_SGL operates as a source side select line and Bottom_SGL operates as a drain side select line; therefore, the select gates connected to Top_SGL are source side select gates and the select gates connected to Bottom_SGL are drain side select gates. As such, the same selection line can concurrently be a drain side selection line for some sub-blocks and a source side selection line for other sub-blocks.

Figure 10:
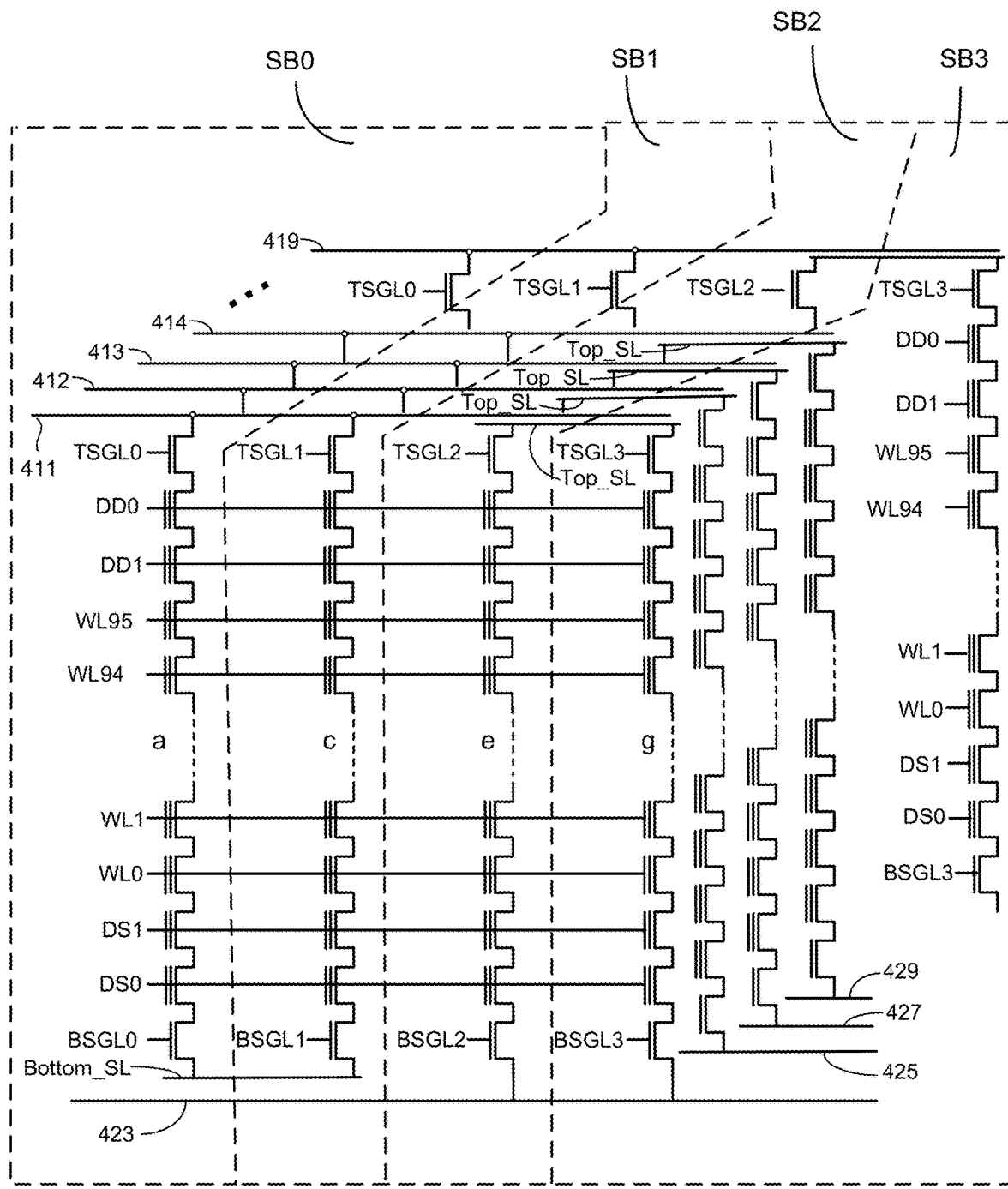
FIG. 10 is a schematic of a plurality of NAND strings showing multiple sub-blocks.

FIG. 10 is a circuit diagram for the embodiment of FIG. 9, depicting a portion of the memory described in in FIGS. 5-8. Specifically, FIG. 10 shows a portion of one block including NAND string a in a sub-block SB0, NAND string c in sub-block SB1, NAND string e in sub-block SB2, NAND string g in sub-block SB0, top bit lines (411, 412, 413, 414, 419), bottom bit lines (423, 425, 427, 429), Bottom_SL, and Top_SL. Top bit lines 411 and 412 correspond to bit lines Top_BLn and Top_BLn+1 of FIG. 9. Bottom bit lines 423 and 425 correspond to bit lines Bottom_BLn and Bottom_BLn+1 of FIG. 9. To make FIG. 10 easier to read, and for example purposes, only one NAND string is depicted for each of the sub-blocks SB0, SB1, SB2 and SB3. FIG. 10 shows physical word lines WLL0-WLL95 running across the entire block. The structure of FIG. 10 corresponds to portion 401 in Block 2 of FIG. 5. Within the block, each bit line is connected to two NAND strings. Top side selection lines TSGL0, TSGL1, TSGL2 and TSGL3 and bottom side selection lines BSGL0, BSGL1, BSGL2 and BSGL3 are used to determine which of the NAND strings connect to the associated bit lines and source line(s).

Figure 11:
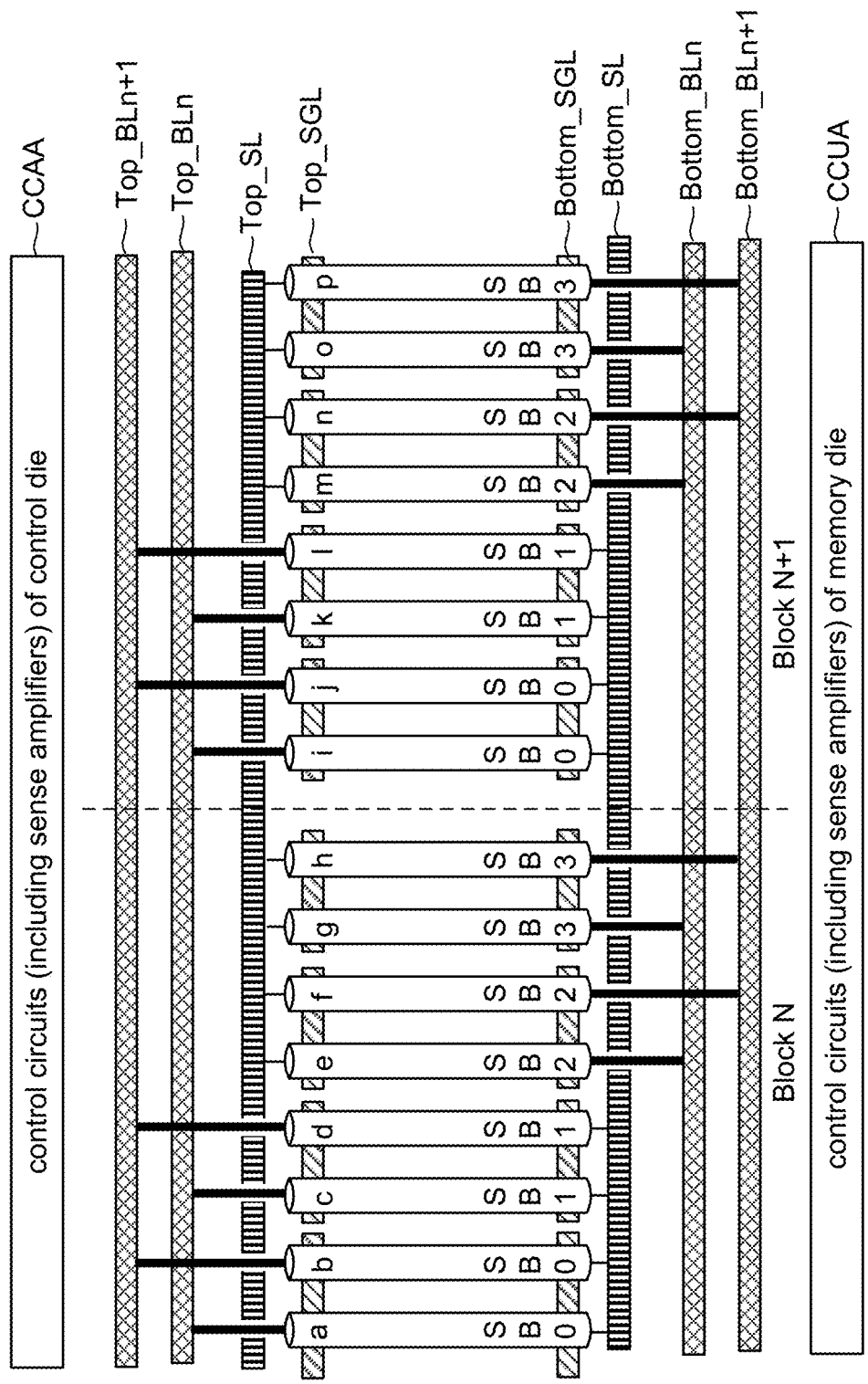
FIG. 11 is a cross sectional view of one embodiment of a portion of two blocks of memory cells.

FIG. 11 is a cross sectional view of one embodiment of a portion of two blocks of memory cells. The structure of FIG. 11 is similar to the structure of FIG. 9, except that the source lines (Top_SL and Bottom_SL) are continuous rather than divided into separate non-continuous sections (as depicted in FIG. 9). In the structure of FIG. 11, the source lines (Top_SL and Bottom_SL) will have been etched (e.g., a hole is etched through the source lines) to allow the bit line contacts (and dielectric surrounding the bit line contacts) to pass through the source lines.

Figure 12:
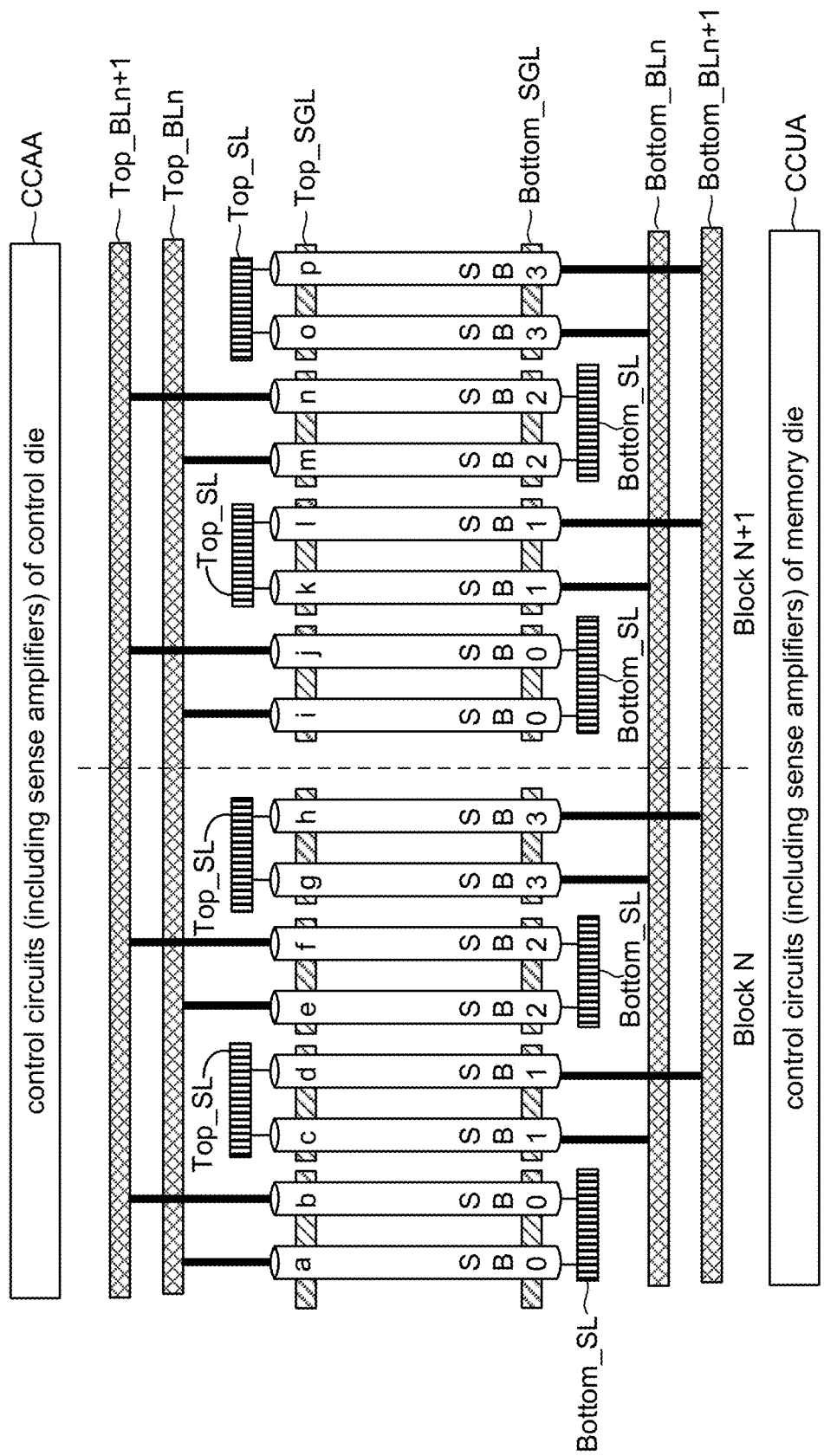
FIG. 12 is a cross sectional view of one embodiment of a portion of two blocks of memory cells.

As discussed above, NAND strings in half of the sub-blocks of a block are connected to sense amplifiers above the memory structure (e.g., on control die 304) and NAND strings in half of the sub-blocks of a block are connected to sense amplifiers below the memory structure (e.g., on memory die 302). In the embodiments of FIGS. 9 and 11, NAND strings of SB0 and SB1 connect to sense amplifiers above the memory structure (e.g., on control die 304) and NAND strings of SB2 and SB3 connect to sense amplifiers below the memory structure (e.g., on memory die 302). FIG. 12 is a cross sectional view of another embodiment of a portion of two blocks of memory cells in which NAND strings of SB0 and SB2 connect to sense amplifiers above the memory structure (e.g., on control die 304) and NAND strings of SB1 and SB3 connect to sense amplifiers below the memory structure (e.g., on memory die 302). Thus, in the embodiment of FIG. 12, NAND strings of SB0 and SB2 connect to bit lines (Top_BLn and Top_BLn+1) above the memory structure and connect to a source line (Bottom_SL) below the memory structure, while NAND strings of SB1 and SB3 connect to bit lines (Bottom_BLn and Bottom_BLn+1) below the memory structure and connect to a source line (Top_SL) above the memory structure. Therefore, a memory operation can be performed on SB0 concurrently with either SB1 or SB3. Similarly, a memory operation can be performed on SB2 concurrently with either SB1 or SB3.

FIGS. 12A and 12B include tables that identify example voltage biases to apply to top side selection lines TSGL0, TSGL1, TSGL2 and TSGL3 (collectively Top_SGL) and bottom side selection lines BSGL0, BSGL1, BSGL2 and BSGL3 (collectively Bottom_SGL) in order to perform writing and reading of data. The table of FIG. 12A applies to the embodiment of FIGS. 9-11. The table of FIG. 12B applies to the embodiment of FIG. 12. For example, the third column of FIG. 12A teaches to concurrently program/write to a NAND string in SB0 (e.g., NAND string a) and a NAND string in SB2 (e.g., NAND string e), the systems applies VSGD to TSGL0, VSS to TSGL1, VSS to TSGL2, VSS to TSGL3, VSS to BSGL0, VSS to BSGL1, VSGD to BSGL2, and VSS to BSGL3. The voltage VSGD is equal to approximately 2.5 volts. The voltage VSS is equal to approximately 0 volts. The voltage VSG is equal to approximately 7 volts. Other voltages can also be used, as per the specific implementation. Note that in the table of FIG. 12B, even though a positive voltage is applied to Top_SGL and Bottom_SGL for a selected NAND strings, that selected NNAD string can be cut off from either the top or bottom by using an appropriate threshold voltage for the transistor that is the select gate.

Figure 13:
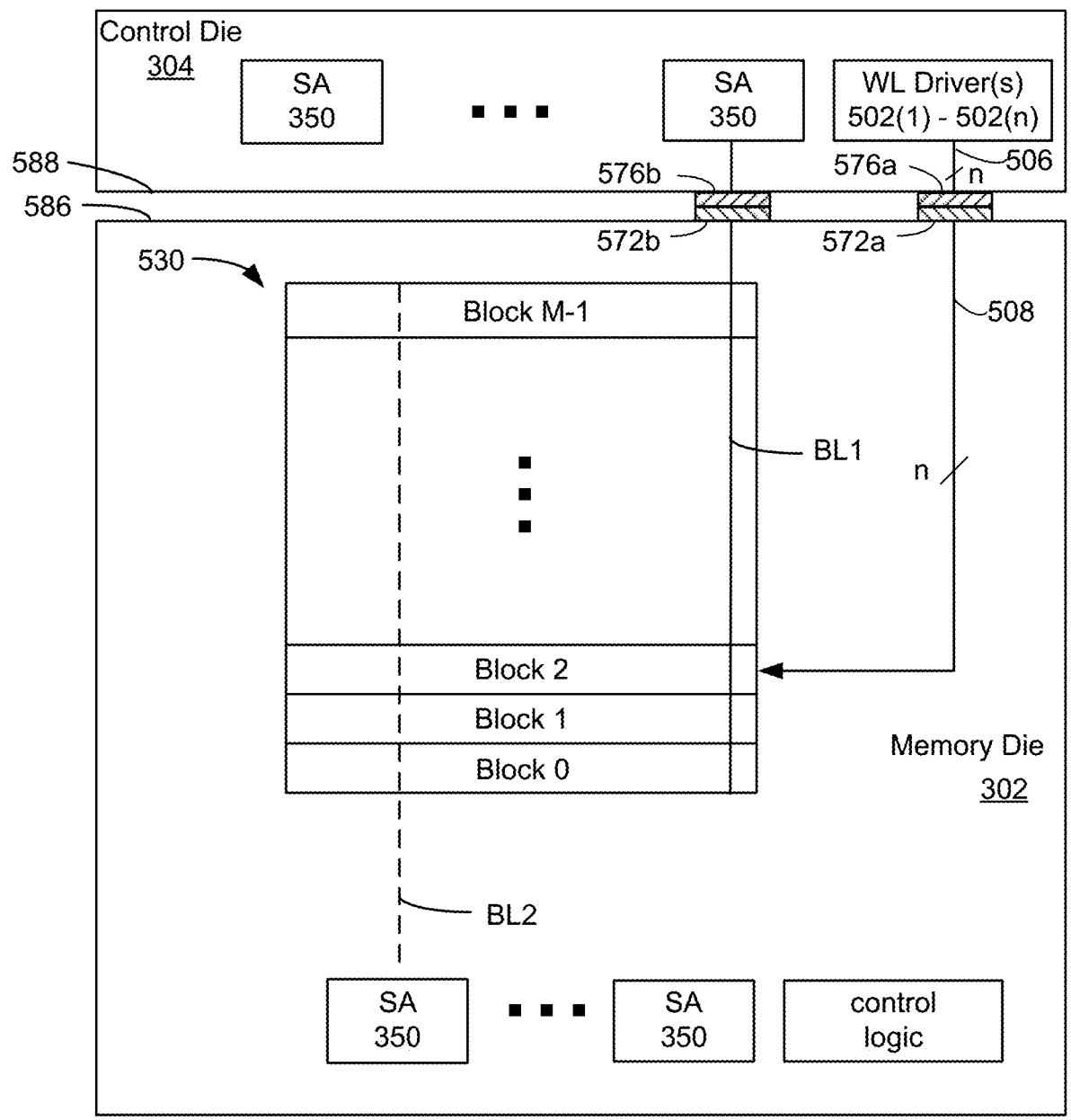
FIG. 13 is a block diagram of one embodiment of an integrated memory assembly.

FIG. 13 is a block diagram depicting further details of one embodiment of an integrated memory assembly, depicting control die 304 bonded to memory die 302. Control die includes a plurality of sense amplifiers 350, a plurality of word line drivers 502(1) . . . 502(n), and other circuits (not depicted in FIG. 13) that cumulatively form a control circuit. On the surface of the substrate of memory die 302 (and between the substrate and the memory structure 326) is a plurality of sense amplifiers 350 and other control logic that that together form a control circuit. Memory die 302 includes at least one plane 530 of memory cells. Plane 530 is all or part of one example embodiment of memory structure 326. Memory die 302 may have additional planes. The plane is divided into M blocks.

Each sense amplifier 350 is connected to one bit line. Two representative bit lines (BL1 and BL2) are depicted for plane 530. There may be thousand or tens of thousands of such bit lines for each plane. Bit line BL1 is on top of plane 530, and is connected to a sense amplifier 350 on control die 304. Bit line BL2 is below plane 530, and is connected to a sense amplifier 350 on the memory die 302 (positioned on the substrate of memory die 302). The sense amplifiers contain bit line drivers. Thus, the sense amplifier may provide a voltage to the bit line to which it is connected. The sense amplifiers are also configured to sense a condition of the bit line. In one embodiment, the sense amplifiers are configured to sense a current that flows in the bit line. In one embodiment, the sense amplifiers are configured to sense a voltage on the bit line.

The control die 304 includes a number of word line drivers 502(1)-502(n). The word line drivers 560 are configured to provide voltages to word lines. In this example, there are "n" word lines per block of memory cells. In one embodiment, one of the blocks in the plane 530 is selected at a time for a memory array operation. If the memory operation is a program or read, one word line within the selected block is selected for the memory operation, in one embodiment. If the memory operation is an erase, all of the word lines within the selected block are selected for the erase, in one embodiment. The word line drivers 502 (e.g. part of Power Control 316) provide voltages to the word lines in a first selected block (e.g., Block 2) in memory die 302. The control die 304 may also include charge pumps, voltage generators, and the like, which may be used to provide voltages for the word line drivers 502 and/or the bit line drivers.

Memory die 302 has a number of bond pads 572a, 572b on a first major surface 586 of memory die 302. There may be "n" bond pads 572a, to receive voltages from a corresponding "n" word line drivers 502(1)-502(n). There may be one bond pad 572b for each bit line associated with plane 530. The reference numeral 572 will be used to refer in general to bond pads on major surface 586.

The control die 304 has a number of bond pads 576a, 576b on a first major surface 588 of control die 304. There may be "n" bond pads 576a, to deliver voltages from a corresponding "n" word line drivers 502(1)-502(n) to memory die 302. There may be one bond pad 576b for each bit line associated with plane 530. The reference numeral 576 will be used to refer in general to bond pads on major surface 588. Note that there may be bond pad pairs 572a/576a and bond pad pairs 572b/576b. In some embodiments, bond pads 570 and/or 574 are flip-chip bond pads (other types can also be used).

In one embodiment, the pattern of bond pads 572 matches the pattern of bond pads 576. Bond pads 572 are bonded (e.g., flip chip bonded) to bond pads 576. Thus, the bond pads 572, 576 electrically and physically couple the memory die 302 to the control die 304. Also, the bond pads 572, 576 permit internal signal transfer between the memory die 302 and the control die 304. Thus, the memory die 302 and the control die 304 are bonded together with bond pads. Although FIG. 13 depicts one control die 304 bonded to one memory die 302, in another embodiment one control die 304 is bonded to multiple memory dies 302.

Herein, "internal signal transfer" means signal transfer between the control die 304 and the memory die 302. The internal signal transfer permits the circuitry on the control die 304 to control memory operations in the memory die 302 via the bond pads. Therefore, the bond pads 572, 576 may be used for memory operation signal transfer. A memory operation signal transfer could include, but is not limited to, providing a voltage, providing a current, receiving a voltage, receiving a current, sensing a voltage, and/or sensing a current.

The bond pads 572, 576 may be formed for example of copper, aluminum and alloys thereof. There may be a liner between the bond pads 572, 576 and the major surfaces (586, 588). The liner may be formed for example of a titanium/titanium nitride stack. The bond pads 572, 576 and liner may be applied by vapor deposition and/or plating techniques. The bond pads and liners together may have a thickness of 720 nm, though this thickness may be larger or smaller in further embodiments.

Metal interconnects and/or vias may be used to electrically connect various elements in the dies to the bond pads 572, 576. Several conductive pathways, which may be implemented with metal interconnects and/or vias are depicted. For example, a sense amplifier 350 may be electrically connected to bond pad 576*b* by a pathway. There may be thousands of such sense amplifiers, pathways, and bond pads. Note that the BL does not necessarily make direct connection to bond pad 572*b*. The word line drivers 560 may be electrically connected to bond pads 576*a* by pathways 508. Note that pathways 508 may comprise a separate conductive pathway for each word line driver 502(1)-502(*n*). Likewise, there may be a separate bond pad 576*a* for each word line driver 502(1)-502(*n*). The word lines in block 2 of the memory die 302 may be electrically connected to bond pads 572*a* by pathways 508.

Figure 14:
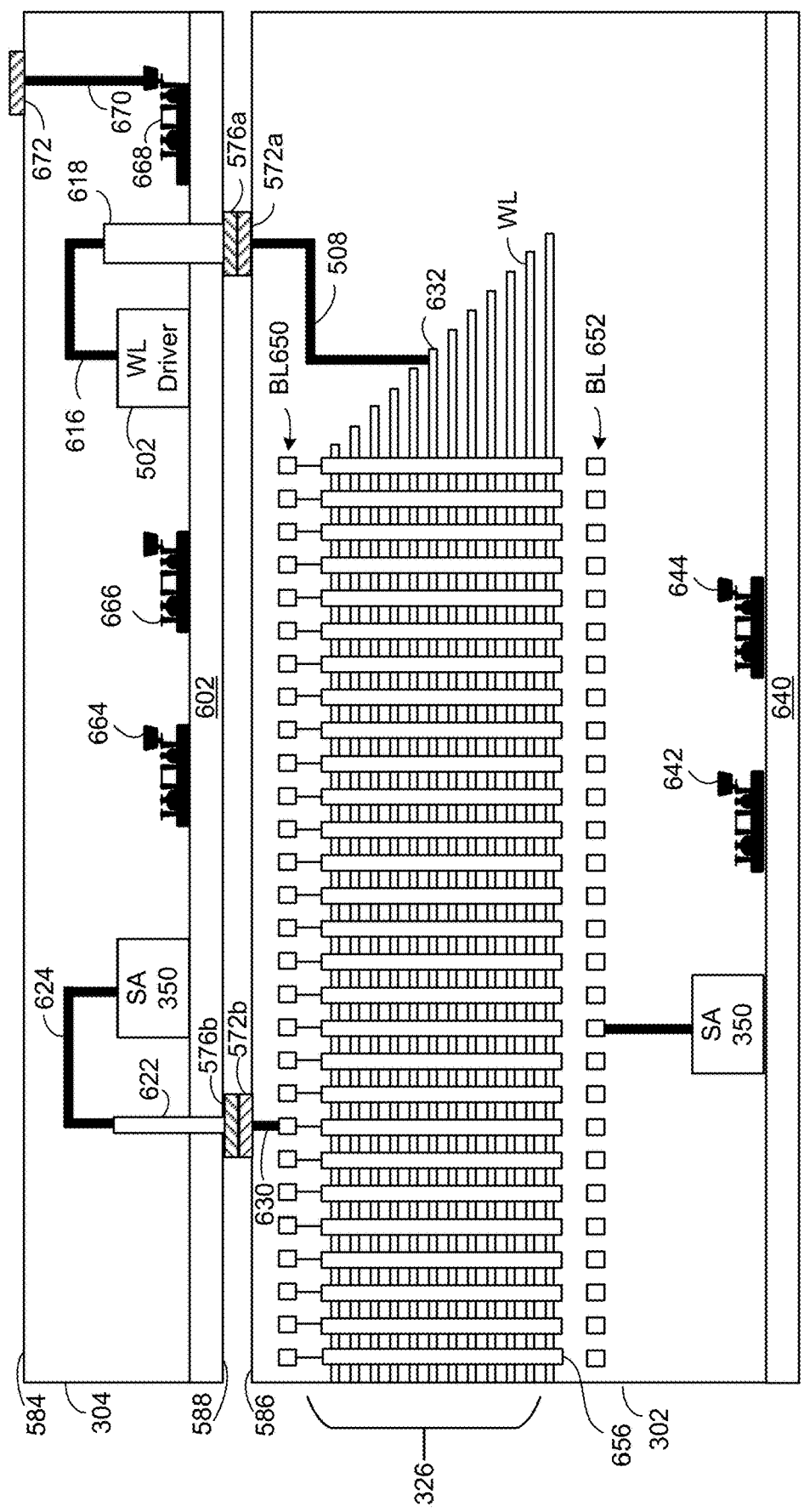
FIG. 14 is a block diagram of one embodiment of an integrated memory assembly.

FIG. 14 is a block diagram depicting additional details of one embodiment of an integrated memory assembly that includes memory die 302 directly bonded to control die 304. This direct bonding configuration is similar to the embodiment depicted in FIG. 13. Note that although a gap is depicted between the pairs of adjacent dies, such a gap may be filled with an epoxy or other resin or polymer.

Memory structure 326 on memory die 302 includes a number of word line layers (WL), which are separated by dielectric layers. The dielectric layers are represented by gaps between the word line layers. Thus, the word line layers and dielectric layers form a stack. There may be many more word line layers than are depicted in FIG. 14. As with the example of FIG. 13, there are a number of columns that extend through the stack. One column is referred to in the stack with reference numeral 656. The columns contain memory cells. For example, each column may contain a NAND string. There are a number of bit lines (BL) above and below the stack.

Memory die 302 includes a substrate 640. On the top surface of substrate 640 is circuitry 642, circuitry 644 and a plurality of sense amplifiers 350 (FIG. 14 only depicts one sense amplifier) that together form a control circuit. In some embodiments, sense amplifiers 350, and/or other circuitry 642/644 comprise CMOS electrical circuits. Memory structure 326 is positioned directly above circuitry 642, circuitry 644 and a plurality of sense amplifiers 350. Memory structure 326 includes bit lines 650 above the memory structure and bit lines 652 below the memory structure. Each sense amplifier 350 on substrate 640 is connected to a bit line 652 below the stack. Each of the memory holes (NAND strings), such as memory hole 656 is connected to one of bit lines 650 or 652, as described above.

Control die 304 includes a substrate 602. On the top surface of substrate 602 is a control circuit comprising a plurality of sense amplifiers 350 (only one sense amplifier is depicted in FIG. 14), circuitry 664, circuitry 666, circuitry 668 and a plurality of word line drivers 502 (only one word line driver is depicted in FIG. 14). In some embodiments, sense amplifiers 350, word line driver(s) 502, and/or other circuitry 664/666/668 comprise CMOS electrical circuits. A sense amplifier 350 is connected to one of the bit lines 650 on top of the memory structure 326 by way of conductive pathway 624, TSV 622, bond pad 576*b*, bond pad 572*b*, and conductive pathway 630. A word line driver 502 is connected to one of the word lines (WL) 632 lines by way of conductive pathway 616, TSV 618, bond pad 576*a*, bond pad 572*a*, and conductive pathway 508.

There is an external signal path that allows circuitry on the control die 304 to communicate with an entity external to the integrated memory assembly 130, such as memory controller 120. Therefore, circuitry 668 on the control die 304 communicates with and provides an interface to memory controller 120. Optionally, circuitry 668 on the control die 304 may communicate with host 120. The external signal path includes via 670 in control die 304 and bond pad 672.

Figure 16:
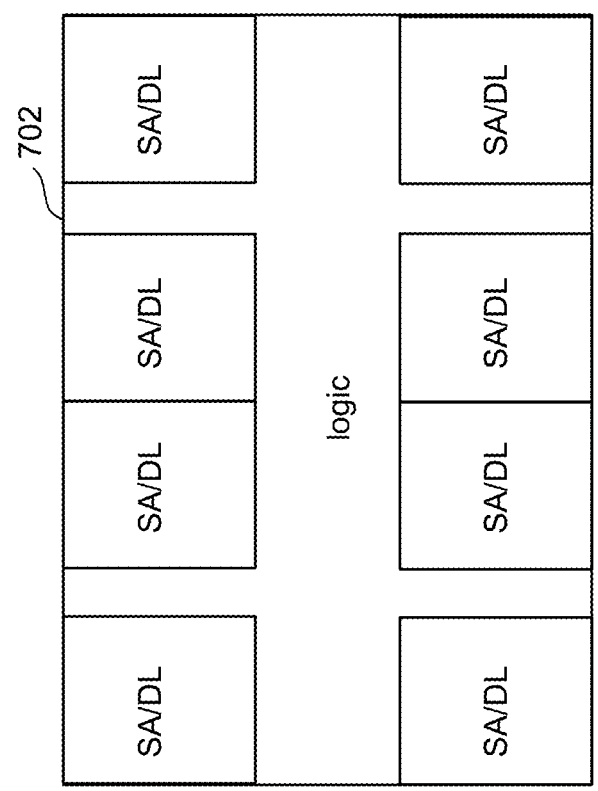
FIG. 16 depicts one embodiment of a floor plan for a memory die.
Figure 15:
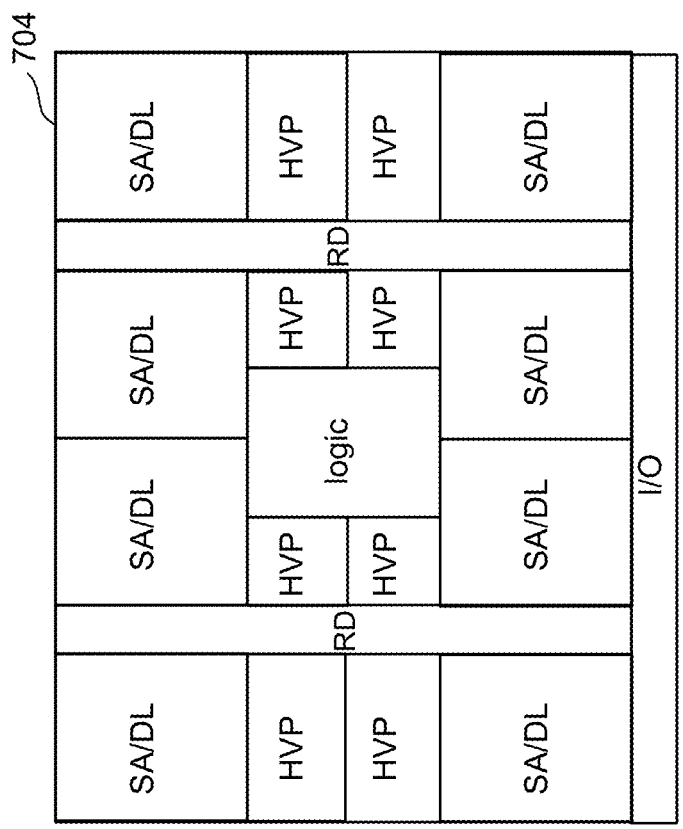
FIG. 15 depicts one embodiment of a floor plan for a control die.

FIG. 15 depicts one embodiment of a floor plan 704 for control die 304 and FIG. 16 depicts one embodiment of a floor plan 702 for memory die 302. Floor plan 704 shows one embodiment of the placement of some of the components that comprise the control circuit on control die 304. For example, floor plan 704 shows placement of eight modules labeled SA/DL, which corresponds to sense amplifiers and data latches. Floor plan 704 also includes eight modules labeled HVP (high voltage pumps), Input/Output circuits (I/O), row decoders (RD) and other logic to implement various control functions (logic). In one embodiment, each of the components of floor plan 704 are electrical circuits positioned on the surface of the substrate of control die 304. In other embodiments, floor plan 704 can place the depicted components in other locations, include other components, and/or include less than all of the components depicted in FIG. 15.

Floor plan 702 shows one embodiment of the placement of some of the components that comprise the control circuit on memory die 302. For example, floor plan 702 shows placement of eight modules labeled SA/DL, which corresponds to sense amplifiers and data latches. The remainder of the floor plan 702 is used for logic to implement various control functions (logic). In one embodiment, each of the components of floor plan 702 are electrical circuits positioned on the surface of the substrate of memory die 302, and are positioned below memory structure 326 so that the components of floor plan 702 are between the substrate and the memory structure. In other embodiments, floor plan 702 can place the depicted components in other locations, include other components, and/or include less than all of the components depicted in FIG. 16. In one embodiment, the logic to implement various control functions (logic) can be used to implement some of the functions depicted to be part of control die 304 in FIG. 2.

Figure 18:
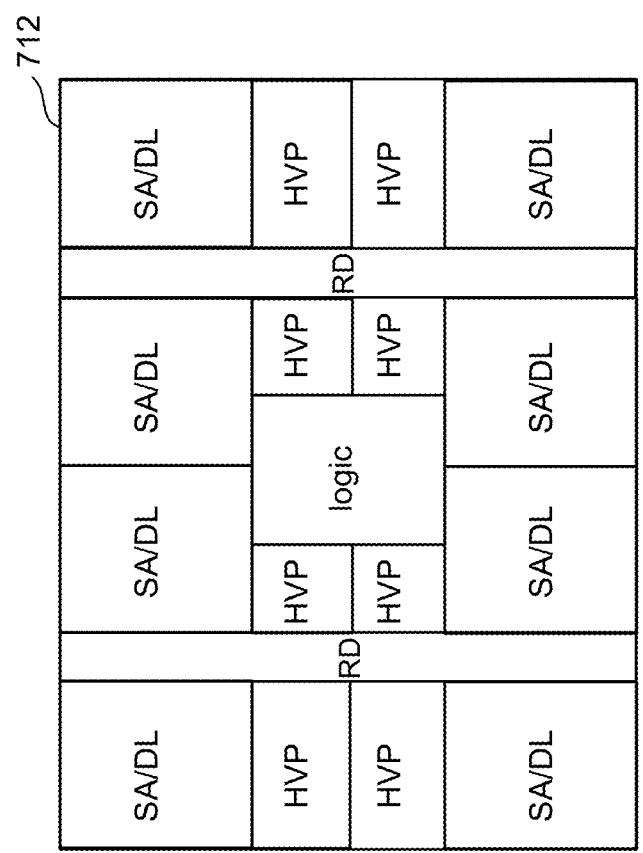
FIG. 18 depicts one embodiment of a floor plan for a memory die.
Figure 17:
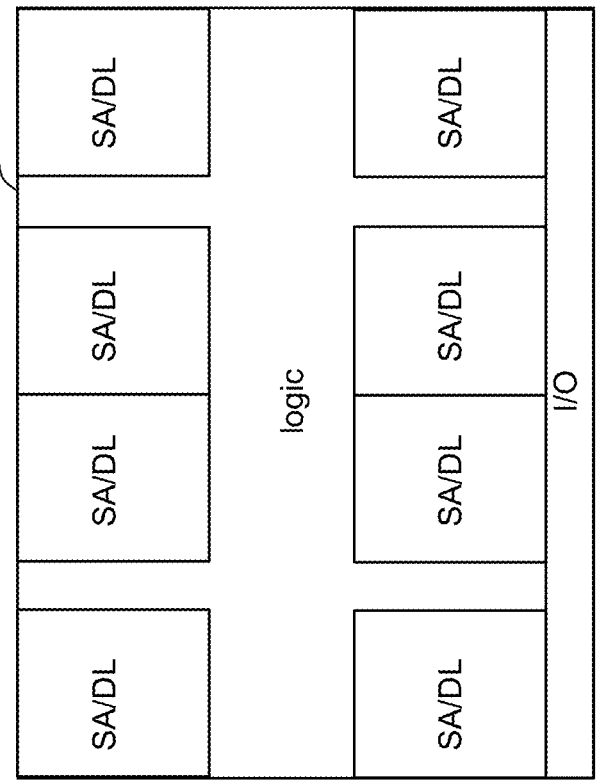
FIG. 17 depicts one embodiment of a floor plan for a control die.

FIG. 17 depicts another embodiment of a floor plan 714 for control die 304 and FIG. 18 depicts another embodiment of a floor plan 712 for memory die 302. Floor plan 714 shows one embodiment of the placement of some of the components that comprise the control circuit on control die 304. For example, floor plan 714 shows placement of eight modules labeled SA/DL, which corresponds to sense amplifiers and data latches. Floor plan 714 also includes logic to implement various control functions (logic) and Input/Output circuits (I/O). In one embodiment, each of the components of floor plan 714 are electrical circuits positioned on the surface of the substrate of control die 304. In other embodiments, floor plan 704 can place the depicted components in other locations, include other components, and/or include less than all of the components depicted in FIG. 17.

Floor plan 712 shows another embodiment of the placement of some of the components that comprise the control circuit on memory die 302. For example, floor plan 712 shows placement of eight modules labeled SA/DL, which corresponds to sense amplifiers and data latches. Floor plan 712 also includes eight modules labeled HVP (high voltage pumps), row decoders (RD) and other logic to implement various control functions (logic). In one embodiment, each of the components of floor plan 712 are electrical circuits positioned on the surface of the substrate of memory die 302, and are positioned below memory structure 326 so that the components of floor plan 712 are between the substrate and the memory structure. In other embodiments, floor plan 712 can place the depicted components in other locations, include other components, and/or include less than all of the components depicted in FIG. 18.

Figure 19:
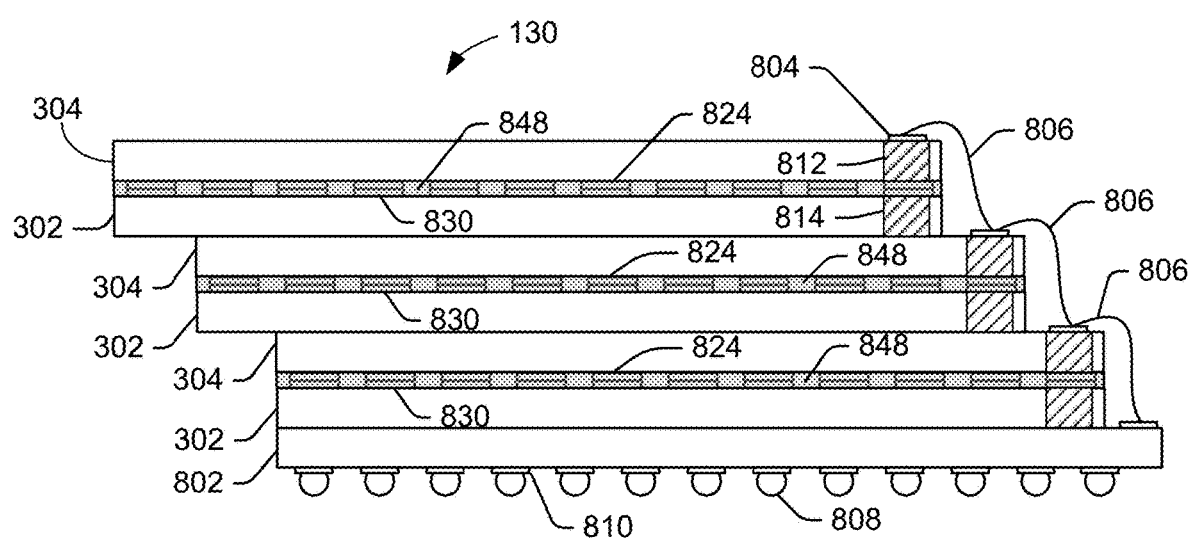
FIG. 19 depicts a side view of an embodiment of an integrated memory assembly.

In some embodiments, there may be more than one control die 304 and more than one memory die 302 in an integrated memory assembly 130. In some embodiments, the integrated memory assembly 130 includes a stack of multiple control die 304 and multiple memory die 302. FIG. 19 depicts a side view of an embodiment of an integrated memory assembly 130 stacked on a substrate 802. The integrated memory assembly 130 has three control die 304 and three memory die 302. Each control die 304 is directly bonded to one of the memory die 302. Some of the bond pads 8730, 824, are depicted. There may be many more bond pads. A space between two dies 302, 304 that are bonded together is filled with a solid layer 848, which may be formed from epoxy or other resin or polymer. This solid layer 848 protects the electrical connections between the dies 302, 304, and further secures the dies together. Various materials may be used as solid layer 848, but in embodiments, it may be Hysol epoxy resin from Henkel Corp.

The integrated memory assembly 130 may for example be stacked with a stepped offset, leaving the bond pads 804 at each level uncovered and accessible from above. Wire bonds 806 connected to the bond pads 804 connect the control die 304 to the substrate 802. A number of such wire bonds may be formed across the width of each control die 304 (i.e., into the page of FIG. 8A).

A through silicon via (TSV) 812 may be used to route signals through a control die 304. A through silicon via (TSV) 814 may be used to route signals through a memory die 302. The TSVs 812, 814 may be formed before, during or after formation of the integrated circuits in the semiconductor dies 302, 304. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 808 may optionally be affixed to contact pads 810 on a lower surface of substrate 802. The solder balls 808 may be used to electrically and mechanically couple the integrated memory assembly 130 to a host device such as a printed circuit board. Solder balls 808 may be omitted where the integrated memory assembly 130 is to be used as an LGA package. The solder balls 808 may form a part of the interface between the integrated memory assembly 130 and memory controller 102.

In the embodiment of FIG. 19, the memory dies 302 and the control dies 304 are arranged as pairs. That is, each memory die 302 is bonded to and in communication with a corresponding/matching/paired control die.

FIG. 20 is a block diagram of a memory structure 900 that includes four planes 902, 904, 906 and 908, and does not utilize the technology proposed herein. That is, memory structure 900 is used in a memory system that does not include sense amplifiers on both the memory die and the control die. Therefore, only one sub-block per plane can be selected for a memory operation at a given time. FIG. 20 shows shading for the sub-blocks such that the horizontal shading represents unselected sub-blocks and the crisscross shading represents selected sub-blocks. FIG. 20 show four sub-bocks of a same block for each plane 902, 904, 906 and 908. For example, sub-blocks 902-0, 902-1, 902-2 and 902-3 are depicted for a same block in plane 902. Of sub-blocks 902-0, 902-1, 902-2 and 902-3, only sub-block 902-3 is selected for a memory operation, with the other sub-blocks being unselected (e.g., idle) during the memory operation. Sub-blocks 904-0, 904-1, 904-2 and 904-3 are depicted for a same block in plane 904. Of sub-blocks 904-0, 904-1, 904-2 and 902-3, only sub-block 904-3 is selected for a memory operation, with the other sub-blocks being unselected (e.g., idle) during the memory operation. Sub-blocks 906-0, 906-1, 906-2 and 906-3 are depicted for a same block in plane 906. Of sub-blocks 906-0, 906-1, 906-2 and 906-3, only sub-block 906-3 is selected for a memory operation, with the other sub-blocks being unselected (e.g., idle) during the memory operation. Sub-blocks 908-0, 908-1, 908-2 and 908-3 are depicted for a same block in plane 908. Of sub-blocks 908-0, 908-1, 908-2 and 908-3, only sub-block 908-3 is selected for a memory operation, with the other sub-blocks being unselected (e.g., idle) during the memory operation.

FIG. 21 is a block diagram of a memory structure 920 that includes four planes of memory cells 922, 924, 9026 and 928 that utilize/incorporate the technology proposed herein. That is, memory structure 920 is used in a memory system that includes sense amplifiers on the memory die and sense amplifiers on the control die, as discussed above with respect to FIGS. 1-19. Therefore, two sub-blocks per plane can be selected for concurrently performing a memory operation, which is twice as much as the system of FIG. 20. FIG. 21 show four sub-bocks of a same block for each plane 922, 924, 926 and 928. For example, sub-blocks 922-0, 922-1, 922-2 and 922-3 are depicted for a same block in plane 922. Of sub-blocks 922-0, 922-1, 922-2 and 922-3, sub-blocks 922-1 and 922-3 are selected for concurrently performing a memory operation, with the other sub-blocks being unselected (e.g., idle) during the memory operation. Sub-blocks 924-0, 924-1, 924-2 and 924-3 are depicted for a same block in plane 924. Of sub-blocks 924-0, 924-1, 924-2 and 922-3, sub-blocks 924-1 and 924-3 are selected for concurrently performing a memory operation, with the other sub-blocks being unselected (e.g., idle) during the memory operation. Sub-blocks 926-0, 926-1, 926-2 and 926-3 are depicted for a same block in plane 926. Of sub-blocks 926-0, 926-1, 926-2 and 926-3, sub-blocks 926-1 and 926-3 are selected for concurrently performing a memory operation, with the other sub-blocks being unselected (e.g., idle) during the memory operation. Sub-blocks 928-0, 928-1, 928-2 and 928-3 are depicted for a same block in plane 928. Of sub-blocks 928-0, 928-1, 928-2 and 928-3, sub-blocks 908-1 and 908-3 are selected for concurrently performing a memory operation, with the other sub-blocks being unselected (e.g., idle) during the memory operation. Therefore, it can be see that using the technology described herein provides a performance enhancement as twice as many memory cells can be concurrently written to and/or read from. Note that when two sub-blocks of a same block are selected for concurrent writing or read, it is the memory cells of the two selected sub-blocks that are connected to the same word line that are concurrently written to and/or read from.

FIG. 21 shows that a memory system with four planes can concurrently write to and/or read from memory cells in eight sub-blocks (two in each plane). Similarly, a memory system with eight planes can concurrently write to and/or read from memory cells in sixteen sub-blocks (two in each plane).

Figure 23:
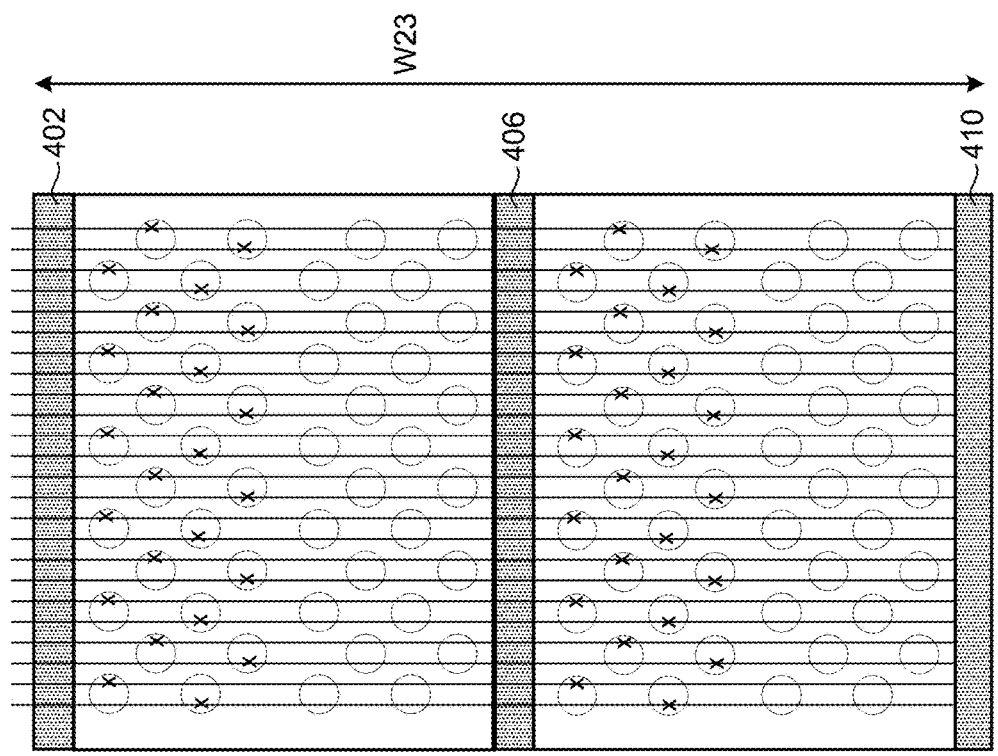
FIG. 23 depicts a top view of a portion of a block of memory cells.
Figure 22:
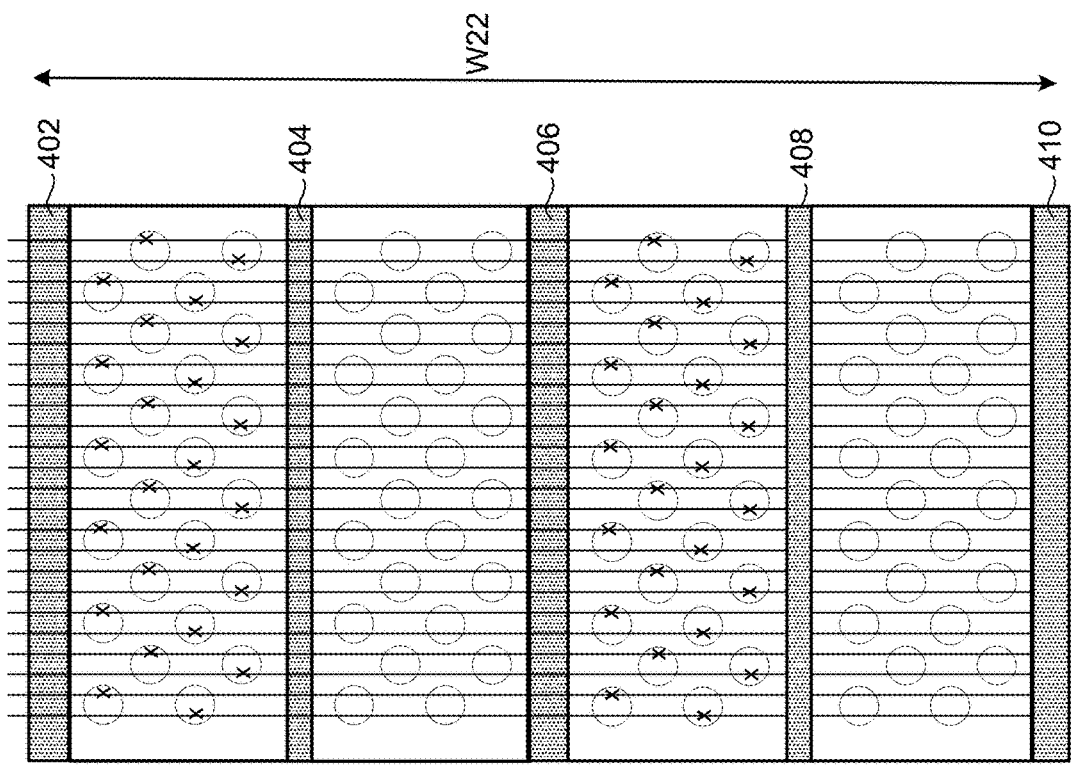
FIG. 22 depicts a top view of a portion of a block of memory cells.

As discussed above, FIG. 6 depicts a top view of a portion of one block from memory structure 326 according to the embodiment of FIG. 9 (sub-blocks SB0 and SB1 are connected to bit lines above memory structure 326 and sub-blocks SB2 and SB3 are connected to bit lines below memory structure 326). FIG. 22 depicts the same top view of the same portion of the same one block from memory structure 326 according to the embodiment of FIG. 12 (sub-blocks SB0 and SB2 are connected to bit lines above memory structure 326 and sub-blocks SB1 and SB3 are connected to bit lines below memory structure 326). In this embodiment of FIGS. 12 and 22, partial slits 404 and 408 can be removed. Partial slit 404 is used so that sub-block SB0 can be selected separately from sub-block SB1. However, since SB0 is connected to bit lines above memory structure 326 and SB1 is connected to bit lines below memory structure 326, partial slit 404 is optional. Similarly, partial slit 408 is used so that sub-block SB2 can be selected separately from sub-block SB3. However, since SB2 is connected to bit lines above memory structure 326 and SB3 is connected to bit lines below memory structure 326k partial slit 408 is optional. FIG. 23 depicts the same top view of the same portion of the same one block as FIG. 22; however, partial slits 404 and 408 have been removed. Removal of partial slits 404 and 408 allows the block of memory cells to be smaller, as width W23 of FIG. 23 is smaller than width W22 of FIG. 22. This can result in a smaller die size, which saves costs and space.

Figure 24:
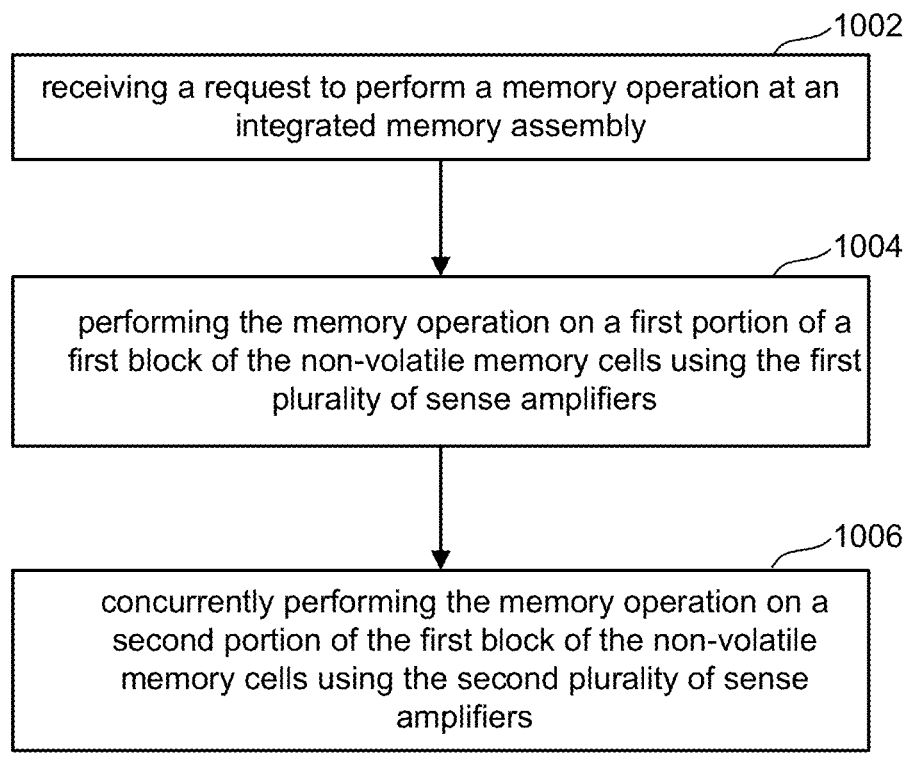
FIG. 24 is a flow chart describing one embodiment of a process for performing a memory operation.

FIG. 24 is a flow chart describing one embodiment of a process for performing a memory operation using the structures discussed above in FIGS. 1-23. In step 1002 of FIG. 24, a request to perform a memory operation (e.g., write or read) is received at integrated memory assembly 130. For example, the request is received at control die 304. The request can be from a memory controller, a host, or another integrated assembly. In step 1004, the integrated memory assembly 130 performs the memory operation on a first portion of a first block of the non-volatile memory cells using a first plurality of sense amplifiers. For example, the control circuit (including sense amplifiers) residing on memory die 302 is used to perform the memory operation in step 1004. The control circuit of control die 304 can (in some embodiments) also be used to perform the memory operations. For example, the memory operation may be performed at the direction of the state machine on control die 304, using the sense amplifiers of the memory die connected to a first sub-block of a selected block of memory cells on the memory die 302. In step 1006, the integrated memory assembly 130 concurrently performs the memory operation on a second portion of the first block of the non-volatile memory cells using a second plurality of sense amplifiers. For example, the control circuit (including sense amplifiers) residing on control die 304 is used to perform the memory operation. In one embodiment, steps 1004 and 1006 are performed concurrently, as discussed above. The process of FIG. 24 can be used with any of the embodiments discussed above. More details of the steps of FIG. 24 are provided below with respect to FIGS. 25-29.

Figure 25:
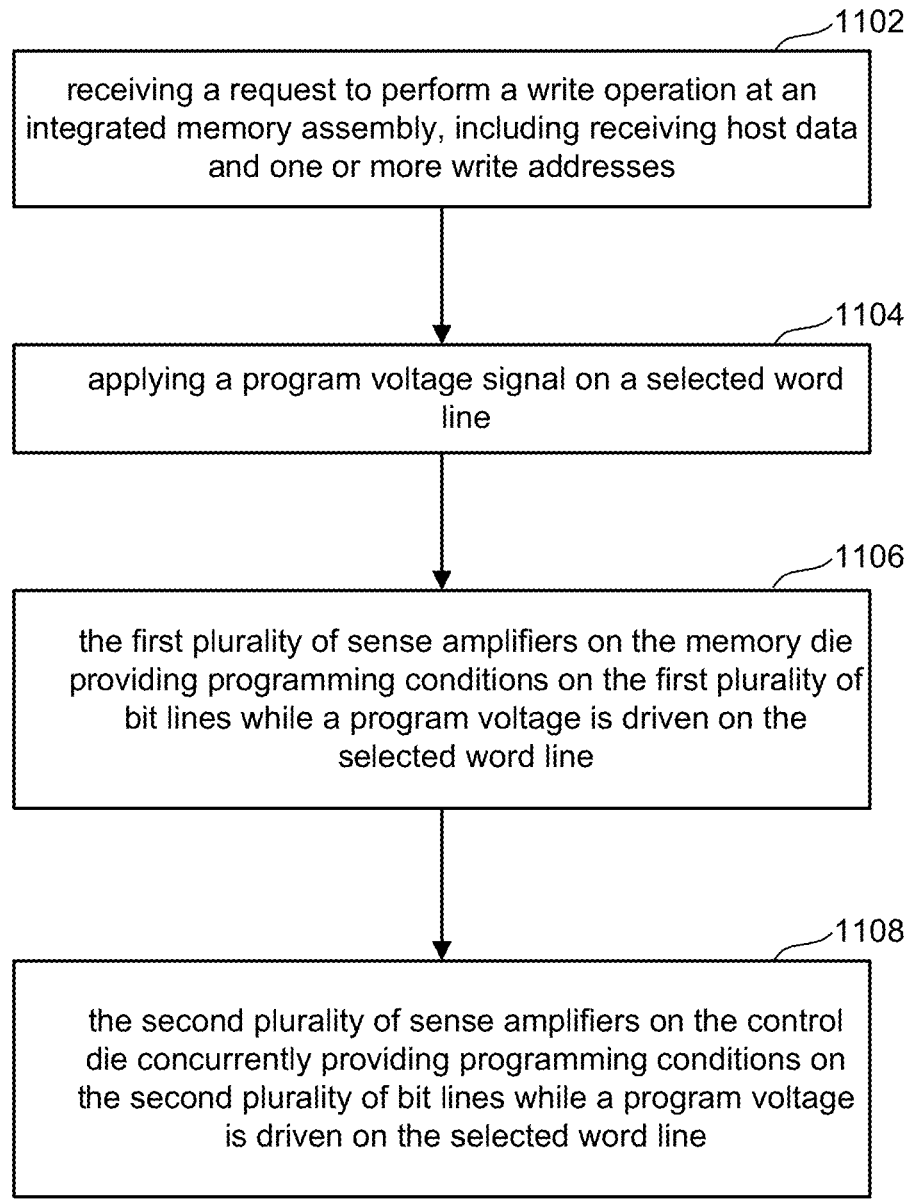
FIG. 25 is a flow chart describing one embodiment of a process for performing a write operation.

FIG. 25 is a flow chart describing one embodiment of a process for performing a write operation. The process of FIG. 25 is one example implementation of the process of FIG. 24. In step 1102 of FIG. 25, integrated memory assembly 130 receives a request to perform a write operation at the integrated memory assembly. For example, control die 304 may receive (from a memory controller) a write command, host data for the write command and one or more write addresses in the memory structure to write the host data to. The host data is data received from the host. In one embodiment, the memory controller received the host data from the host and forwards it to the integrated memory assembly. In step 1104, control die 304 applies a program voltage signal on a selected word line of memory structure 326. Additionally, the selection lines (Top_SGL and Bottom_SGL) are biases as depicted in FIG. 12A or 12B (or another suitable biasing scheme). In step 1106, a first plurality of sense amplifiers on memory die 302 provide programming conditions on the first plurality of bit lines while the program voltage is driven on the selected word line. The first plurality of sense amplifiers on memory die 302 are connected to bit lines under memory structure 326, as discussed above. In step 1108, the second plurality of sense amplifiers on control die 304 provide programming conditions on the second plurality of bit lines while the program voltage is driven on the selected word line. The second plurality of sense amplifiers on control die 304 are connected to bit lines above memory structure 326, as discussed above. In one embodiment, the sense amplifiers provide programming conditions by apply a small voltage or 0 volts on the bit lines. As a result of steps 1102-1108, host data is programmed into memory structure 326. In one embodiment, step 1106 is performed concurrently with step 1108 so that memory cells connected to a common word line but in two sub-blocks are written to concurrently.

Figures 26, 27:
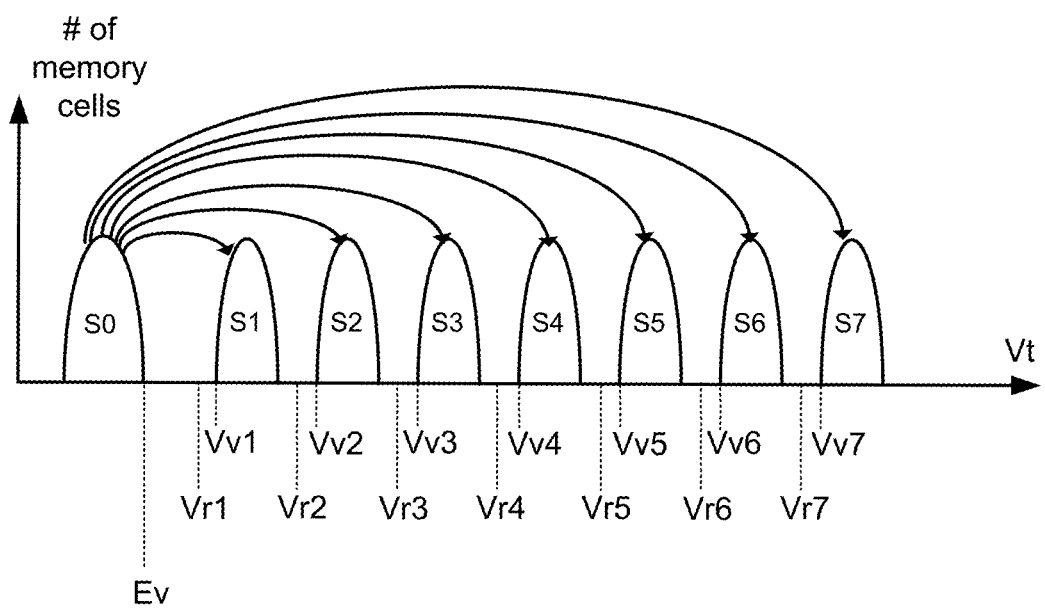
FIG. 26 depicts threshold voltage distributions.
FIG. 27 is a table describing one example of an assignment of data values to data states.

At the end of a successful programming process, the threshold voltages of the memory cells should be within one or more distributions of threshold voltages for programmed memory cells or within a distribution of threshold voltages for erased memory cells, as appropriate. FIG. 26 is a graph of threshold voltage versus number of memory cells, and illustrates example threshold voltage distributions for memory structure 326 when each memory cell stores three bits of data. Other embodiments, however, may use other data capacities per memory cell (e.g., such as one, two, four, or five bits of data per memory cell). FIG. 26 shows eight threshold voltage distributions, corresponding to eight data states. For a data state N, that data state N has higher threshold voltages than data state N−1 and lower threshold voltages than data state N+1. The first threshold voltage distribution (data state) S0 represents memory cells that are erased. The other seven threshold voltage distributions (data states) S1-S7 represent memory cells that are programmed and, therefore, are also called programmed states or programmed data states. In some embodiments, data states S1-S7 can overlap, with controller 122 relying on error correction to identify the correct data being stored.

FIG. 26 shows seven read reference voltages, Vr1, Vr2, Vr3, Vr4, Vr5, Vr6, and Vr7 for reading data from memory cells. By testing (e.g., performing sense operations) whether the threshold voltage of a given memory cell is above or below the seven read reference voltages, the system can determine what data state (i.e., S0, S1, S2, S3, . . . ) a memory cell is in.

FIG. 26 also shows seven verify reference voltages, Vv1, Vv2, Vv3, Vv4, Vv5, Vv6, and Vv7 (also referred to as verify target voltages). When programming memory cells to data state S1, the system will test whether those memory cells have a threshold voltage greater than or equal to Vv1. When programming memory cells to data state S2, the system will test whether the memory cells have threshold voltages greater than or equal to Vv2. When programming memory cells to data state S3, the system will determine whether memory cells have their threshold voltage greater than or equal to Vv3. When programming memory cells to data state S4, the system will test whether those memory cells have a threshold voltage greater than or equal to Vv4. When programming memory cells to data state S5, the system will test whether those memory cells have a threshold voltage greater than or equal to Vv5. When programming memory cells to data state S6, the system will test whether those memory cells have a threshold voltage greater than or equal to Vv6. When programming memory cells to data state S7, the system will test whether those memory cells have a threshold voltage greater than or equal to Vv7.

In one embodiment, known as full sequence programming, memory cells can be programmed from the erased data state S0 directly to any of the programmed data states S1-S7. For example, a population of memory cells to be programmed (e.g., memory cells that are in two sub-blocks of a plane and connected to a same word line) may first be erased so that all memory cells in the population are in erased data state S0. Then, a programming process is used to program memory cells directly into data states S1, S2, S3, S4, S5, S6, and/or S7. For example, while some memory cells are being programmed from data state S0 to data state S1, other memory cells are being programmed from data state S0 to data state S2 and/or from data state S0 to data state S3, and so on. The arrows of FIG. 26 represent the full sequence programming. The technology described herein can also be used with other types of programming in addition to full sequence programming, including (but not limited to) multiple stage/phase programming.

Each threshold voltage distribution (data state) of FIG. 26 corresponds to predetermined values for the set of data bits stored in the memory cells. The specific relationship between the data programmed into the memory cell and the threshold voltage levels of the memory cell depends upon the data encoding scheme adopted for the memory cells. In one embodiment, data values are assigned to the threshold voltage ranges using a Gray code assignment so that if the threshold voltage of a memory erroneously shifts to its neighboring physical state, only one bit will be affected.

FIG. 27 is a table describing one example of an assignment of data values to data states. In the table of FIG. 27, S0=111 (erased state), S1=110, S2=100, S3=000, S4=010, S5=011, S6=001 and S7=101. Other encodings of data can also be used. No particular data encoding is required by the technology disclosed herein. In one embodiment, when a block is subjected to an erase operation, all memory cells are moved to data state S0, the erased state.

In general, during verify operations and read operations, the selected word line is connected to a voltage (one example of a reference signal), a level of which is specified for each read operation (e.g., see read reference voltages Vr1, Vr2, Vr3, Vr4, Vr5, Vr6, and Vr7, of FIG. 26) or verify operation (e.g. see verify reference voltages Ev, Vv1, Vv2, Vv3, Vv4, Vv5, Vv6, and Vv7 of FIG. 26) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages (also referred to as bypass voltages) at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

Figure 28:
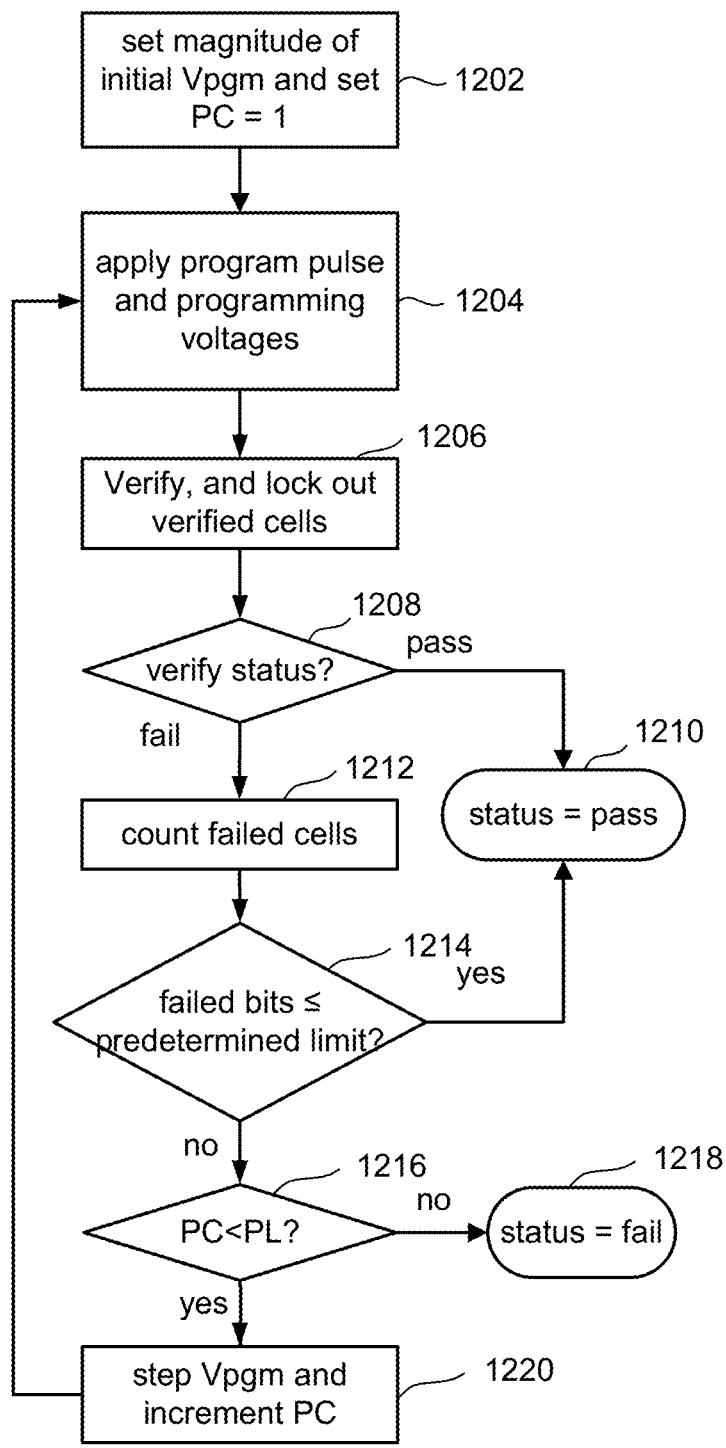
FIG. 28 is a flow chart describing one embodiment of a process for programming non-volatile memory.

FIG. 28 is a flowchart describing one embodiment of a process for programming memory structure 326. In one example embodiment, the process of FIG. 28 is performed on control die 302 using the sense amplifiers on the control die and the sense amplifiers on the memory die as discussed above, at the direction of state machine 312. The process of FIG. 28 is performed to implement the full sequence programming of FIG. 26, as well as other programming schemes including multi-stage programming. When implementing multi-stage programming, the process of FIG. 28 is used to implement any/each stage of the multi-stage programming process. The process of FIG. 28 can be used to perform the process of FIG. 25.

Typically, the program voltage applied to the control gates (via a selected word line) during a program operation is applied as a series of program pulses (voltage pulses). Between programming pulses are a set of verify pulses to perform verification. In many implementations, the magnitude of the program pulses is increased with each successive pulse by a predetermined step size. In step 1202 of FIG. 28, the programming voltage (Vpgm) is initialized to the starting magnitude (e.g., ~12-16V or another suitable level) and a program counter PC maintained by state machine 312 is initialized at 1. In step 1204, a program pulse of the program signal Vpgm is applied to the selected word line (the word line selected for programming). In one embodiment, the group of memory cells being programmed concurrently are all connected to the same word line (the selected word line). The unselected word lines receive one or more boosting voltages (e.g., ~7-11 volts) to perform boosting schemes known in the art. The program pulse applied to the selected word line is an example of the program voltage signal of step 1104 of FIG. 25. In one embodiment, if a memory cell should be programmed, then the corresponding bit line is grounded (e.g., the programming condition of steps 1106 and 1108 of FIG. 25). On the other hand, if the memory cell should remain at its current threshold voltage, then the corresponding bit line is connected to Vdd to inhibit programming. In step 1204, the program pulse is concurrently applied to all memory cells connected to the selected word line so that all of the memory cells connected to the selected word line are programmed concurrently. That is, they are programmed at the same time or during overlapping times (both of which are considered concurrent). In this manner all of the memory cells connected to the selected word line will concurrently have their threshold voltage change, unless they have been locked out from programming.

In step 1206, the appropriate memory cells are verified using the appropriate set of verify reference voltages to perform one or more verify operations. In one embodiment, the verification process is performed by testing whether the threshold voltages of the memory cells selected for programming have reached the appropriate verify reference voltage. In step 1208, it is determined whether all the memory cells have reached their target threshold voltages (pass). If so, the programming process is complete and successful because all selected memory cells were programmed and verified to their target states. A status of "PASS" (or success) is reported in step 1210. If, in step 1208, it is determined that not all of the memory cells have reached their target threshold voltages (fail), then the programming process continues to step 1212. In step 1212, the system counts the number of memory cells that have not yet reached their respective target threshold voltage distribution. That is, the system counts the number of memory cells that have, so far, failed the verify process. This counting can be done by the state machine 312, the controller 120, or other logic. In one implementation, each of the sense blocks will store the status (pass/fail) of their respective memory cells. In one embodiment, there is one total count, which reflects the total number of memory cells currently being programmed that have failed the last verify step. In another embodiment, separate counts are kept for each data state.

In step 1214, it is determined whether the count from step 1212 is less than or equal to a predetermined limit. In one embodiment, the predetermined limit is a number of bits that can be corrected by error correction codes (ECC) during a read process for the page of memory cells. If the number of failed cells is less than or equal to the predetermined limit, than the programming process can stop and a status of "PASS" is reported in step 1210. In this situation, enough memory cells programmed correctly such that the few remaining memory cells that have not been completely programmed can be corrected using ECC during the read process. In some embodiments, step 1212 will count the number of failed cells for each sector, each target data state or other unit, and those counts will individually or collectively be compared to one or more thresholds in step 1214.

In one embodiment, the predetermined limit can be less than the total number of bits that can be corrected by ECC during a read process to allow for future errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not pre-determined. Instead, it changes based on the number of errors already counted for the page, the number of program-erase cycles performed or other criteria.

If number of failed memory cells is not less than the predetermined limit, than the programming process continues at step 1216 and the program counter PC is checked against the program limit value (PL). Examples of program limit values include 6, 20 and 30; however, other values can be used. If the program counter PC is not less than the program limit value PL, then the program process is considered to have failed and a status of FAIL is reported in step 1218. If the program counter PC is less than the program limit value PL, then the process continues at step 1220 during which time the Program Counter PC is incremented by 1 and the program voltage Vpgm is stepped up to the next magnitude. For example, the next pulse will have a magnitude greater than the previous pulse by a step size (e.g., a step size of 0.1-0.8 volts). After step 1220, the process loops back to step 1204 and another program pulse is applied to the selected word line so that another iteration (steps 1204-1220) of the programming process of FIG. 28 is performed.

Because it is possible that errors can occur when programming or reading, and errors can occur while storing data (e.g., due to electrons drifting, data retention issues or other phenomenon), error correction is used with the programming of data. Memory systems often use Error Correction Codes (ECC) to protect data from corruption. Many ECC coding schemes are well known in the art. These conventional error correction codes are especially useful in large scale memories, including flash (and other non-volatile) memories, because of the substantial impact on manufacturing yield and device reliability that such coding schemes can provide, rendering devices that have a few non-programmable or defective cells as useable. Of course, a tradeoff exists between the yield savings and the cost of providing additional memory cells to store the code bits (i.e., the code "rate"). As such, some ECC codes are better suited for flash memory devices than others. Generally, ECC codes for flash memory devices tend to have higher code rates (i.e., a lower ratio of code bits to data bits) than the codes used in data communications applications (which may have code rates as low as 1/2). Examples of well-known ECC codes commonly used in connection with flash memory storage include Reed-Solomon codes, other BCH codes, Hamming codes, and the like. Sometimes, the error correction codes used in connection with flash memory storage are "systematic," in that the data portion of the eventual code word is unchanged from the actual data being encoded, with the code or parity bits appended to the data bits to form the complete code word.

The particular parameters for a given error correction code include the type of code, the size of the block of actual data from which the code word is derived, and the overall length of the code word after encoding. For example, a typical BCH code applied to a sector of 512 bytes (4096 bits) of data can correct up to four error bits, if at least 60 ECC or parity bits are used. Reed-Solomon codes are a subset of BCH codes, and are also commonly used for error correction. For example, a typical Reed-Solomon code can correct up to four errors in a 512 byte sector of data, using about 72 ECC bits. In the flash memory context, error correction coding provides substantial improvement in manufacturing yield, as well as in the reliability of the flash memory over time.

In some embodiments, controller 120 receives host data (also referred to as user data or data from an entity external to the memory system), also referred to as information bits, that is to be stored non-volatile memory structure 326. The informational bits are represented by the matrix i=[1 0] (note that two bits are used for example purposes only, and many embodiments have code words longer than two bits). An error correction coding process (such as any of the processes mentioned above or below) is implemented by ECC engine 158 of controller 120 in which parity bits are added to the informational bits to provide data represented by the matrix or code word v=[1 0 1 0], indicating that two parity bits have been appended to the data bits. Other techniques can be used that map input data to output data in more complex manners. For example, low density parity check (LDPC) codes, also referred to as Gallager codes, can be used. More details about LDPC codes can be found in R. G. Gallager, "Low-density parity-check codes," IRE Trans. Inform. Theory, vol. IT-8, pp. 21 28, January 1962; and D. MacKay, Information Theory, Inference and Learning Algorithms, Cambridge University Press 2003, chapter 47. In practice, such LDPC codes are typically applied (e.g., by ECC engine 158) to multiple pages encoded across a number of storage elements, but they do not need to be applied across multiple pages. In some embodiments, the ECC process (encoding data and/or decoding data) can be performed by ECC engine 330 on control die 304. In some embodiments, the ECC process (encoding data and/or decoding data) can be performed by an ECC engine on memory die 302 (e.g., the ECC engine is part of the logic depicted in FIG. 16.

In one embodiment, programming serves to raise the threshold voltage of the memory cells to one of the programmed data states S1-S7. Erasing serves to lower the threshold voltage of the memory cells to the Erase data state S0.

One technique to erase memory cells in some memory devices is to bias a p-well (or other types of) substrate to a high voltage to charge up a NAND channel. An erase enable voltage (e.g., a low voltage) is applied to control gates of memory cells while the NAND channel is at a high voltage to erase the non-volatile storage elements (memory cells). Herein, this is referred to as p-well erase.

Another approach to erasing memory cells is to generate gate induced drain leakage (GIDL) current to charge up the NAND string channel. An erase enable voltage is applied to control gates of the memory cells, while maintaining the NAND string channel potential to erase the memory cells. Herein, this is referred to as GIDL erase. Both p-well erase and GIDL erase may be used to lower the threshold voltage (Vt) of memory cells.

In one embodiment, the GIDL current is generated by causing a drain-to-gate voltage at a select transistor (e.g., SGD and/or SGS). A transistor drain-to-gate voltage that generates a GIDL current is referred to herein as a GIDL voltage. The GIDL current may result when the select transistor drain voltage is significantly higher than the select transistor control gate voltage. GIDL current is a result of carrier generation, i.e., electron-hole pair generation due to band-to-band tunneling and/or trap-assisted generation. In one embodiment, GIDL current may result in one type of carriers, e.g., holes, predominantly moving into NAND channel, thereby raising potential of the channel. The other type of carriers, e.g., electrons, are extracted from the channel, in the direction of a bit line or in the direction of a source line, by an electric field. During erase, the holes may tunnel from the channel to a charge storage region of memory cells and recombine with electrons there, to lower the threshold voltage of the memory cells.

The GIDL current may be generated at either end of the NAND string. A first GIDL voltage may be created between two terminals of a select transistor (e.g., drain side select transistor) that is connected to a bit line to generate a first GIDL current. A second GIDL voltage may be created between two terminals of a select transistor (e.g., source side select transistor) that is connected to a source line to generate a second GIDL current. Erasing based on GIDL current at only one end of the NAND string is referred to as a one-sided GIDL erase. Erasing based on GIDL current at both ends of the NAND string is referred to as a two-sided GIDL erase.

Figure 29:
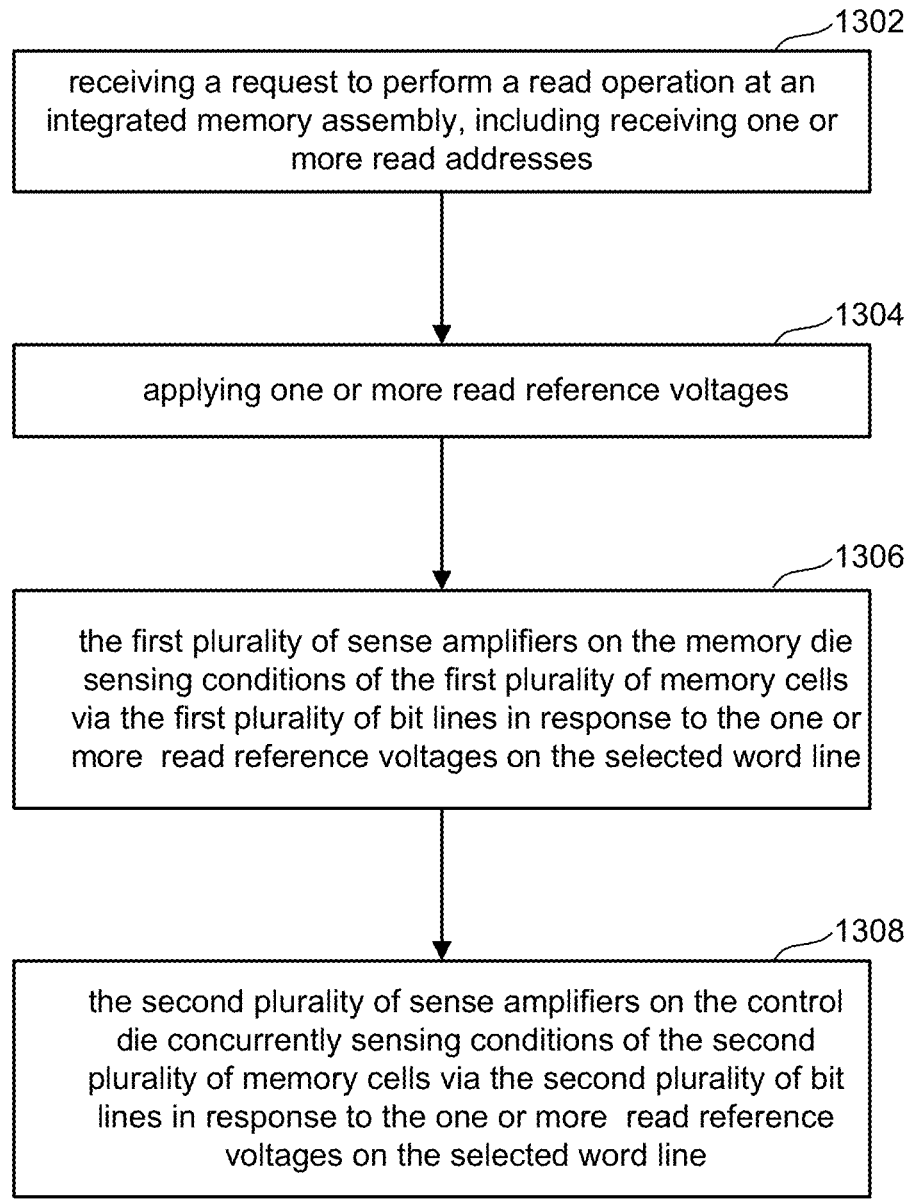
FIG. 29 is a flow chart describing one embodiment of a process for reading non-volatile memory.

FIG. 29 is a flow chart describing one embodiment of a process for performing a read operation. The process of FIG. 29 is one example implementation of the process of FIG. 24. In step 1302 of FIG. 29, integrated memory assembly 130 receives a request to perform a read operation, including receiving one or more read addresses. For example, control die 302 may receive a read command and a read address from a memory controller. In step 1304, control die 304 applies one or more read reference voltages. For example, the word line drivers discussed above can be used by control die 304 to drive any of the read reference voltages (e.g., Vr1, Vr2, Vr3, Vr4, Vr5, Vr6, and/or Vr7) on the selected word line. Additionally, the selection lines (Top_SGL and Bottom_SGL) are biases as depicted in FIGS. 12A or 12B (or another suitable biasing scheme). In step 1306, the first plurality of sense amplifiers on the memory die sense conditions of the first plurality of memory cells (e.g., first sub-block) via the first plurality of bit lines (e.g., bit lines below the memory structure) in response to the one or more read reference voltages on the selected word line. In step 1308, the second plurality of sense amplifiers on the control die sense conditions of the second plurality of memory cells (e.g., second sub-block of same bock as first sub-block) via the second plurality of bit lines (e.g., bit lines below the memory structure) in response to the one or more read reference voltages on the selected word line. Steps 1306 and 1308 are performed concurrently so that two sub-blocks per plane are read at the same time.

Figure 30:
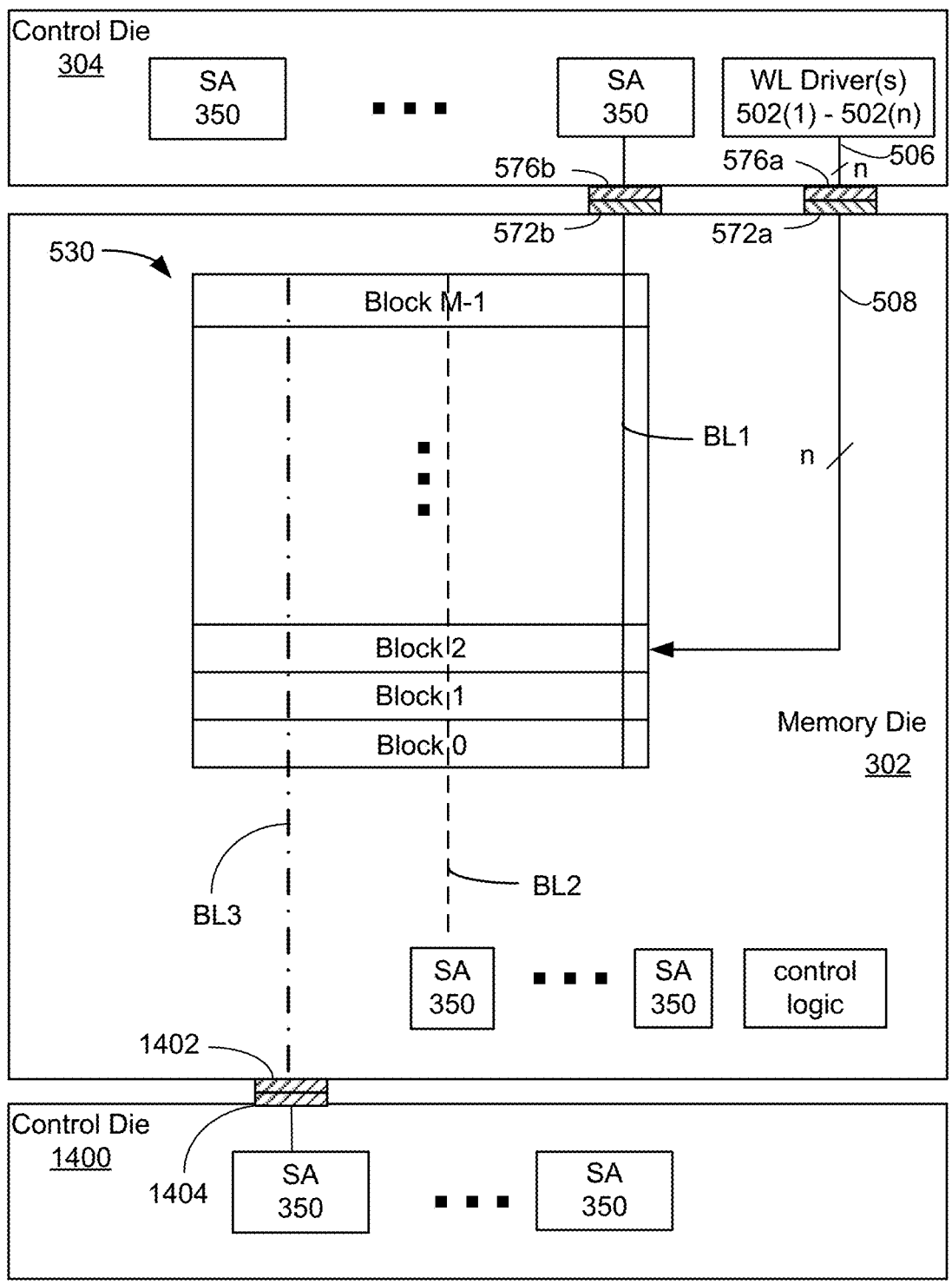
FIG. 30 is a block diagram of one embodiment of an integrated memory assembly.

FIG. 30 is a block diagram depicting further details of one embodiment of an integrated memory assembly that implements a three die system. For example, FIG. 30 depicts control die 304 bonded to memory die 302 as described above with respect to FIG. 13, and also depicts an additional control die 1400 (third die) bonded (connected) to memory die 302. In one embodiment, control die 1400 has the same structure as control die 304, including a control circuit comprising a plurality of sense amplifiers 350. In some embodiments, control die 1400 has a plurality of sense amplifiers 350 like control die 304, but control die 1400 does not include word line drivers and other logic that does not need to be duplicated in control die 1400 (as compared to control die 304).

Each sense amplifier 350 is connected to one bit line. Three representative bit lines (BL1, BL2 and BL3) are depicted. Bit line BL3 can be positioned below or above the memory cells. For example, FIG. 9 shows half of the bit lines connected to the sense amplifiers on memory die 302 and half of the bit lines connected to the sense amplifiers on control die 304, while in embodiments of FIG. 30 zero or more of the bit lines below the memory array can be connected to sense amplifiers of control die 1400 and zero or more of the bit lines above the memory array can be connected to sense amplifiers of control die 1400. In this manner, the sense amplifiers on memory die 302 are connected to a first set of memory cells in a block, the sense amplifiers on control die 304 are connected to a second set of memory cells in the same block, and the sense amplifiers on control die 1400 are connected to a third set of memory cells in the same block. In one example embodiment, the sense amplifiers on memory die 302 are connected to memory cells in a first sub-block of a block, the sense amplifiers on control die 304 are connected to memory cells in a second sub-block of the same block, and the sense amplifiers on control die 1400 are connected to memory cells in a third sub-block of the same block.

Memory die 302 further incudes bond pads 1402. Control die 1404 includes bond pads 1404 connected to bond pads 1402. There may be "n" bond pads 1402 and "n" bond pads 1404 to transfer signals between the bit lines of memory die 302 and the sense amplifiers of control die 1404.

In the embodiment of FIG. 13, the control circuit of memory die 302 performs a memory operation on a first subset of the memory cells concurrently with the control circuit of control die 304 performing the memory operation on a second subset of the memory cells. In the embodiment of FIG. 30, the control circuit of control die 1400 is configured to be used to perform the memory operation on a third subset of the memory cells concurrently with the control circuit of memory die 302 performing the memory operation on the first subset of the memory cells and the control circuit of control die 304 performing the memory operation on the second subset of the memory cells. Other embodiments may include additional control die (e.g., more than two control dies with sense amplifiers connected to bit lines on the memory die).

A memory has been described that includes control circuits (e.g., including sense amplifiers) on the same die as the memory array and control circuits (e.g., including sense amplifiers) on a different die than the memory array, so that the number of sense amplifiers (or equivalent circuits) can be increased. Increasing the number of sense amplifiers increases the amount of parallelism, which results in an increase in performance of the memory system. Additionally, the increases in the amount of parallelism can result in a more efficient use of power and additional functionality.

One embodiment includes a non-volatile storage apparatus comprising a first semiconductor die and a second semiconductor die. The first semiconductor die comprises a substrate, a first control circuit positioned on the substrate, and non-volatile memory cells positioned directly above the first control circuit. The second semiconductor die comprises a second control circuit on a substrate. The second semiconductor die further comprises an interface to a memory controller and an interface to the first semiconductor die. The second semiconductor die is directly connected to the first semiconductor die. The first control circuit is configured to be used to perform a memory operation on a first subset of the non-volatile memory cells while the second control circuit is configured to be used to concurrently perform a memory operation on a second subset of the non-volatile memory cells.

In one example implementation, the non-volatile memory cells are organized into blocks of non-volatile memory cells; the first subset of the non-volatile memory cells and the second subset of the non-volatile memory cells are part of a first block and connected to a first word line; the first block is divided into multiple sub-blocks including a first sub-block and a second sub-block; the first subset of the non-volatile memory cells are in the first sub-block; the second subset of the non-volatile memory cells are in the second sub-block; the first control circuit comprises a first set of sense amplifiers that are connected to the first subset of the non-volatile memory cells in the first sub-block; and the second control circuit comprises a second set of sense amplifiers that are connected to the second subset of non-volatile memory cells in the second sub-block.

One example implementation further comprises a third semiconductor die comprising a third control circuit, the third semiconductor die is connected to the first semiconductor die, the third control circuit is configured to be used to perform the memory operation on a third subset of the non-volatile memory cells concurrently with the first control circuit performing the memory operation on the first subset of the non-volatile memory cells and the second control circuit performing the memory operation on the second subset of the non-volatile memory cells.

One embodiment includes a non-volatile storage apparatus comprising a memory controller and an integrated memory assembly separate from the memory controller and in communication with the memory controller via a communication path. The integrated memory assembly comprises a memory die and a control die bonded to the memory die. The memory die comprises a three dimensional non-volatile memory structure and a first plurality of sense amplifiers. The first plurality of sense amplifiers are connected to the memory structure and are positioned on a substrate of the memory die between the memory structure and the substrate such that the memory structure is directly above the first plurality of sense amplifiers. The control die has a first interface for communicating with the memory controller and a second interface for communicating with the memory die. The second interface is wider than the first interface. The control die comprises a second plurality of sense amplifiers that are connected to the memory structure via the second interface. The first plurality of sense amplifiers and the second plurality of sense amplifiers are configured to be used to concurrently write data to the memory structure.

In one example implementation, the first plurality of sense amplifiers and the second plurality of sense amplifiers are configured to be used to read data from the memory structure such that the first plurality of sense amplifiers are used to read data from a first portion of the memory structure while the second plurality of sense amplifiers are used to concurrently read data from a second portion of the memory structure.

One embodiment includes a method of operating a non-volatile storage apparatus, comprising: receiving a request to perform a memory operation at an integrated memory assembly, the integrated memory assembly comprises a memory die and a control die bonded to the memory die, the memory die comprises a three dimensional non-volatile memory structure and a first plurality of sense amplifiers, the control die comprises a second plurality of sense amplifiers that are connected to the memory structure, the memory structure is organized into blocks of non-volatile memory cells; and performing the memory operation on a first portion of a first block of the non-volatile memory cells using the first plurality of sense amplifiers while concurrently performing the memory operation on a second portion of the first block of the non-volatile memory cells using the second plurality of sense amplifiers.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more others parts). In some cases, when an element is referred to as being connected or coupled to another element, the element may be directly connected to the other element or indirectly connected to the other element via one or more intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A non-volatile storage apparatus, comprising:
   a first semiconductor die comprising a substrate, a first set of sense amplifiers positioned on the substrate and non-volatile memory cells; and
   a second semiconductor die comprising a second set of sense amplifiers, the second semiconductor die further comprises an interface to a memory controller and an interface to the first semiconductor die, the second semiconductor die is directly connected to the first semiconductor die, the first set of sense amplifiers is configured to be used to perform a memory operation on a first subset of the non-volatile memory cells, the second set of sense amplifiers is configured to be used to perform the memory operation on a second subset of the non-volatile memory cells.

2. The non-volatile storage apparatus of claim 1, wherein:
   the first set of sense amplifiers is configured to perform the memory operation on the first subset of the non-volatile memory cells while the second set of sense amplifiers concurrently performs the memory operation on the second subset of the non-volatile memory cells.

3. The non-volatile storage apparatus of claim 1, wherein:
   the first subset of the non-volatile memory cells are positioned directly above the first set of sense amplifiers.

4. The non-volatile storage apparatus of claim 3, wherein:
   the non-volatile memory cells are organized into blocks of non-volatile memory cells;
   the first subset of the non-volatile memory cells and the second subset of the non-volatile memory cells are part of a same block and connected to a same word line.

5. The non-volatile storage apparatus of claim 4, further comprising:
   a first plurality of bit lines below the non-volatile memory cells, the first plurality of bit lines are connected to the first set of sense amplifiers and the first subset of the non-volatile memory cells; and
   a second plurality of bit lines above the non-volatile memory cells, the second plurality of bit lines are connected to the second set of sense amplifiers and the second subset of the non-volatile memory cells.

6. The non-volatile storage apparatus of claim 5, wherein the first semiconductor die comprising further comprises:
   a first source line above the non-volatile memory cells, the first source line is connected to the first subset of non-volatile memory cells; and
   a second source line below the non-volatile memory cells, the second source line is connected to the second subset of non-volatile memory cells.

7. The non-volatile storage apparatus of claim 6, wherein:
   the first source line is continuous across the same block.

8. The non-volatile storage apparatus of claim 6, wherein:
   the first source line is divided into non-continuous sections.

9. The non-volatile storage apparatus of claim 1, wherein:
   the non-volatile memory cells are organized into blocks of non-volatile memory cells;
   the first subset of the non-volatile memory cells and the second subset of the non-volatile memory cells are part of a first block and connected to a first word line;
   the first block is divided into multiple sub-blocks including a first sub-block and a second sub-block;
   the first subset of the non-volatile memory cells are in the first sub-block; and
   the second subset of the non-volatile memory cells are in the second sub-block.

10. The non-volatile storage apparatus of claim 9, wherein:
    a third subset of the non-volatile memory cells are connected to the first word line and are in a third sub-block of the first block;
    a fourth subset of the non-volatile memory cells are connected to the first word line and are in a fourth sub-block of the first block;
    the first set of sense amplifiers is connected to the third subset of the non-volatile memory cells;
    the second set of sense amplifiers is connected to the fourth subset of the non-volatile memory cells;
    the first set of sense amplifiers is configured to perform the memory operation on the third subset of the non-volatile memory cells while the second set of sense amplifiers concurrently performs the memory operation on the fourth subset of the non-volatile memory cells.

11. The non-volatile storage apparatus of claim 1, further comprising:
    a third semiconductor die comprising a third set of sense amplifiers, the third semiconductor die is connected to the first semiconductor die, the third set of sense amplifiers is configured to be used to perform the memory operation on a third subset of the non-volatile memory cells concurrently with the first set of sense amplifiers performing the memory operation on the first subset of the non-volatile memory cells and the second set of sense amplifiers performing the memory operation on the second subset of the non-volatile memory cells.

12. A non-volatile storage apparatus, comprising:
    a first semiconductor die comprising a substrate, a first control circuit positioned on the substrate, and non-volatile memory cells positioned directly above the first control circuit; and
    a second semiconductor die comprising a second control circuit, the second semiconductor die further comprises an interface to a memory controller and an interface to the first semiconductor die, the second semiconductor die is directly connected to the first semiconductor die, the first control circuit is configured to be used to perform a memory operation on a first subset of the non-volatile memory cells, the second control circuit is configured to be used to perform the memory operation on a second subset of the non-volatile memory cells;

the non-volatile memory cells are part of vertical NAND strings that each include a first select gate at a first end and a second select gate at a second end;

the first select gates of the NAND strings are connected by a first select line that operates as a source side select line for a first subset of the NAND strings and a drain side select line for a second subset of the NAND strings; and the second select gates of the NAND strings are connected by a second select line that operates as a drain side select line for the first subset of the NAND strings and a source side select line for the second subset of the NAND strings.

13. A non-volatile storage apparatus, comprising:

a memory controller; and an integrated memory assembly separate from the memory controller and in communication with the memory controller via a communication path, the integrated memory assembly comprises a memory die and a control die bonded to the memory die, the memory die comprises a three dimensional non-volatile memory structure and a first plurality of sense amplifiers, the first plurality of sense amplifiers are connected to the memory structure and are positioned on a substrate of the memory die between the memory structure and the substrate such that the memory structure is directly above the first plurality of sense amplifiers, the control die has a first interface for communicating with the memory controller and a second interface for communicating with the memory die, the second interface is wider than the first interface, the control die comprises a second plurality of sense amplifiers that are connected to the memory structure via the second interface, the first plurality of sense amplifiers and the second plurality of sense amplifiers are configured to be used to write data to the memory structure.

14. The non-volatile storage apparatus of claim 13, wherein the first plurality of sense amplifiers and the second plurality of sense amplifiers are configured to be used to write data to the memory structure such that the first plurality of sense amplifiers are used to write data to a first portion of the memory structure while the second plurality of sense amplifiers are used to concurrently write data to a second portion of the memory structure.

15. The non-volatile storage apparatus of claim 13, wherein:

the first plurality of sense amplifiers and the second plurality of sense amplifiers are configured to be used to read data from the memory structure such that the first plurality of sense amplifiers are used to read data from a first portion of the memory structure while the second plurality of sense amplifiers are used to concurrently read data from a second portion of the memory structure.

16. The non-volatile storage apparatus of claim 13, wherein:

the memory structure is organized into blocks of non-volatile memory cells; and the first plurality of sense amplifiers and the second plurality of sense amplifiers are configured to be used to write data to the memory structure such that the first plurality of sense amplifiers are used to write data to memory cells of a first subset of memory cells of a block of memory cells while the second plurality of sense amplifiers are used to concurrently write data to a second subset of memory cells of the block of memory cells, the first subset of memory cells and the second subset of memory cells are connected to a selected word line.

17. A method of operating a non-volatile storage apparatus, comprising:

receiving a request to perform a memory operation at an integrated memory assembly, the integrated memory assembly comprises a memory die and a control die bonded to the memory die, the memory die comprises a three dimensional non-volatile memory structure and a first plurality of sense amplifiers, the control die comprises a second plurality of sense amplifiers that are connected to the memory structure, the memory structure is organized into blocks of non-volatile memory cells; and performing the memory operation on a first portion of a first block of the non-volatile memory cells using the first plurality of sense amplifiers while concurrently performing the memory operation on a second portion of the first block of the non-volatile memory cells using the second plurality of sense amplifiers.

18. The method of claim 17, wherein:

the first portion of the first block of the non-volatile memory cells comprises a first plurality of memory cells connected to a selected word line, a first source line above the memory structure and a first plurality of bit lines below the memory structure;

the first plurality of bit lines are connected to the first plurality of sense amplifiers;

the second portion of the first block of the non-volatile memory cells comprises a second plurality of memory cells connected to the selected word line, a second source line below the memory structure and a second plurality of bit lines above the memory structure; and the second plurality of bit lines are connected to the second plurality of sense amplifiers.

19. The method of 18, wherein:

the performing the memory operation on the first portion of the first block of the non-volatile memory cells using the first plurality of sense amplifiers comprises the first plurality of sense amplifiers on the memory die sensing conditions of the first plurality of memory cells via the first plurality of bit lines in response to a read reference voltage on the selected word line; and the performing the memory operation on the second portion of the first block of the non-volatile memory cells using the second plurality of sense amplifiers comprises the second plurality of sense amplifiers on the control die sensing conditions of the second plurality of memory cells via the second plurality of bit lines in response to the read reference voltage on the selected word line.

20. The method of 18, wherein:

the performing the memory operation on the first portion of the first block of the non-volatile memory cells using the first plurality of sense amplifiers comprises the first plurality of sense amplifiers on the memory die providing programming conditions on the first plurality of bit lines while a program voltage is driven on the selected word line; and the performing the memory operation on the second portion of the first block of the non-volatile memory cells using the second plurality of sense amplifiers comprises the second plurality of sense amplifiers on the control die providing programming conditions on the second plurality of bit lines while a program voltage is driven on the selected word line.

* * * * *